US007828929B2

(12) United States Patent
Lee et al.

(10) Patent No.: US 7,828,929 B2
(45) Date of Patent: Nov. 9, 2010

(54) METHODS AND DEVICES FOR MONITORING AND CONTROLLING THIN FILM PROCESSING

(75) Inventors: William David Lee, Westminster, CO (US); Dale C. Ness, Broomfield, CO (US); Alan D. Streater, Boulder, CO (US)

(73) Assignee: Research Electro-Optics, Inc., Boulder, CO (US)

( * ) Notice: Subject to any disclaimer, the term of this patent is extended or adjusted under 35 U.S.C. 154(b) by 986 days.

(21) Appl. No.: 11/314,811

(22) Filed: Dec. 21, 2005

(65) Prior Publication Data

US 2006/0144335 A1 Jul. 6, 2006

Related U.S. Application Data

(60) Provisional application No. 60/640,539, filed on Dec. 30, 2004.

(51) Int. Cl.
C23F 1/00 (2006.01)
H01L 21/306 (2006.01)

(52) U.S. Cl. ................................. 156/345.55
(58) Field of Classification Search ............. 156/345.55
See application file for complete search history.

(56) References Cited

U.S. PATENT DOCUMENTS

| 4,079,280 | A | 3/1978 | Kusters et al. |
| 4,100,879 | A | 7/1978 | Goldin et al. |
| 4,121,537 | A | 10/1978 | Maruyama et al. |
| 4,207,836 | A | 6/1980 | Nonaka |
| 4,728,863 | A | 3/1988 | Wertheimer |
| 4,790,921 | A | 12/1988 | Bloomquist et al. |
| 4,834,855 | A | 5/1989 | Bloomquist et al. |
| 4,858,556 | A | 8/1989 | Seibert |

(Continued)

FOREIGN PATENT DOCUMENTS

JP 55-11134 1/1980

(Continued)

OTHER PUBLICATIONS

Chapman et al. (1988) "Introduction to Sputtering," In; Handbook of Thin-Film Deposition Processes and Techniques, Principles, Methods, Equipment, and Applications, Klaus et al. Eds., Noyes Publications, pp. 291-318.

(Continued)

Primary Examiner—Michael Cleveland
Assistant Examiner—Keath T Chen
(74) Attorney, Agent, or Firm—Greenlee Sullivan P.C.

(57) ABSTRACT

Thin film processing systems and methods are provided having a moving deposition sensor capable of translation and/or rotation in a manner that exposes the sensor to thin film deposition environments in a flux region substantially the same as the deposition environments experienced by one or more moveable substrates during a selected deposition period. In one embodiment, a thin film monitoring and control system is provided wherein one or more moveable substrates and a moveable deposition sensor are moved along substantially coincident trajectories in a flux region of a thin film deposition system for a selected deposition period. Systems and methods of the present invention may include SC-cut quartz crystal microbalance sensors capable of excitation of at least two different resonant modes.

41 Claims, 13 Drawing Sheets

U.S. PATENT DOCUMENTS

| | | | |
|---|---|---|---|
| 4,872,765 A | 10/1989 | Schodowski | |
| 4,981,566 A | 1/1991 | Wurczinger | |
| 5,029,555 A | 7/1991 | Dietrich et al. | |
| 5,308,461 A | 5/1994 | Ahonen | |
| 5,798,027 A | 8/1998 | Lefebvre et al. | |
| 5,869,763 A | 2/1999 | Vig et al. | |
| 5,980,975 A | 11/1999 | Nomura et al. | |
| 6,190,511 B1 | 2/2001 | Wei | |
| 6,338,775 B1 | 1/2002 | Chen | |
| 6,610,179 B2 | 8/2003 | Baldwin et al. | |
| 6,622,295 B1 | 9/2003 | Schepp et al. | |
| 6,649,208 B2 | 11/2003 | Rodgers | |
| 6,651,488 B2 | 11/2003 | Larson, III et al. | |
| 6,668,207 B1 | 12/2003 | Montcalm et al. | |
| 6,668,618 B2 | 12/2003 | Larson, III et al. | |
| 2002/0176097 A1 | 11/2002 | Rodgers | |
| 2004/0046969 A1 | 3/2004 | Anderson | |

FOREIGN PATENT DOCUMENTS

| | | |
|---|---|---|
| JP | 3-56672 | 3/1991 |
| JP | 9-249971 | 9/1997 |
| JP | 9-256155 | 9/1997 |
| WO | 9419508 | 9/1994 |
| WO | 2004025219 | 3/2004 |

OTHER PUBLICATIONS

Kern et al. (1988) "Deposition Technologies and Applications: Introduction and Overview," In; Handbook of Thin-Film Deposition Processes and Techniques, Principles, Methods, Equipment, and Applications, Klaus et al. Eds., Noyes publications, pp. 1-25.

Lu et al. (1972) "Investigation of Film-Thickness Determination by Oscillating Quartz Resonators With Large Mass Load,"Lu et al. (1972) "Investigation of Film-Thickness Determination by Oscillating Quartz Resonators With Large Mass Load."

Richier et al. (1995) "Optical Monitoring of Thin-Film Thickness," In; Thin Films for Optical Systems (Optical Engineering), Flory et al. Eds., arcel Dekker, Ch. 3, pp. 57-90.

Search Report Corresponding to GB 0526327.2, Mailed Apr. 19, 2006.

Examination Report Corresponding to GB 0526327.2, dated Aug. 31, 2010.

METHODS AND DEVICES FOR MONITORING AND CONTROLLING THIN FILM PROCESSING

CROSS-REFERENCE TO RELATED APPLICATIONS

This application claims priority under 35 U.S.C. 119(e) to U.S. provisional Patent Application 60/640,539 filed Dec. 30, 2004, which is hereby incorporated by reference in its entirety to the extent not inconsistent with the disclosure herein.

BACKGROUND OF THE INVENTION

Thin film deposition methods enable the fabrication of a wide range of useful devices and device components. Chemical and physical thin film deposition techniques, such as ion beam sputtering, plasma enhanced chemical thin film deposition, electron beam evaporation and thermal evaporation, for example, are particularly useful methods for fabricating complex structures comprising thin films of a variety of materials, including dielectric materials, semiconductors, and conducting materials. Structures have been fabricated using thin film deposition methods having selected thicknesses ranging from 10 s of nanometers to 10 s of centimeters. The applicability of thin film deposition techniques to a wide variety of deposition materials, substrates and processing conditions has lead to widespread adoption of these techniques in a number of important fields including semiconductors, microelectronics, nanotechnology, lithography and thin film optical coatings.

In thin film deposition techniques, a substrate to be coated is placed in contact with a precursor having a selected composition, such as gas phase molecules, ions, atoms and clusters thereof. Condensation of the precursor itself on a receiving surface of the substrate results in formation of a thin film layer in physical thin film deposition methods, such as ion beam sputtering and evaporative deposition techniques. Alternatively, in chemical thin film deposition methods, a substrate is exposed to a precursor, which reacts and/or decomposes on the receiving surface resulting in formation of a thin film layer having a desired chemical composition. Deposition typically occurs under reduced pressure conditions provided by a vacuum chamber for both physical thin film deposition and chemical thin film deposition techniques. In many device fabrication applications, a receiving surface of a substrate is successively and independently exposed to different precursors, thereby generating complex multilayer structures comprising a plurality of distinct thin film layers having different chemical compositions and physical properties.

In thin film deposition systems, the flux of precursors to a substrate depends on a large number of variables. First, the collision rate of precursors to the substrate surface is largely determined by the concentration (or partial pressure) and translational energy of precursors in a region proximate to the substrate surface. Second, the fraction of collisions leading to condensation on or reaction with the surface depends on the composition of the precursors, composition and morphology of the substrate surface, the electric charge at the surface, ambient pressure and ambient temperature. Finally, the flux of precursor to a substrate also depends on the geometry defining the relative positions of the receiving surface of the substrate and the thin film deposition source. The amount of material deposited onto the substrate surface at a particular point and at a particular time depends on the flux of precursors to a substrate and on the amount of time this point on the substrate surface is exposed to the deposition flux. For many thin film deposition systems, a number of these variables vary from point to point across a receiving surface; therefore, the flux of precursors to the substrate surface is often spatially inhomogeneous.

In many cases, the utility of thin film deposition methods for device fabrication applications is dependent on the capability of these techniques to generate thin film layers having uniform physical thicknesses, chemical compositions and physical properties, such as refractive index, density, optical thickness and surface roughness. Many thin film deposition sources, such as sputtering sources and evaporation sources, generate a spatially inhomogeneous source distribution profile of precursors. Spatial inhomogeneity of the concentrations of the precursors in a region proximate to the substrate can lead to nonuniform fluxes of precursors to the receiving surface. This spatial variability of the flux of precursors often results in deposition of thin film coatings having thicknesses which vary significantly from point to point across the receiving surface of a substrate. Such variability in the thickness of deposited thin film layers can impede the performance of devices fabricated using thin film deposition methods. For example, spatial variability in the thickness of thin films comprising multilayer thin film optical components, such as optical interference filters and antireflection coatings, may result in devices having optical transmission and/or reflection properties that vary as a function of position of a beam on an incident surface.

A number of techniques exist to address problems associated with spatially inhomogeneous source distribution profiles of precursors generated by many thin film deposition sources. One useful method for achieving thin films having improved thickness uniformity uses substrate positioning systems, such as planetary systems, that translate and/or rotate a substrate in a flux region during the thin film deposition process. In a dual planet planetary system, for example, one or more rotating planets carry substrates and the rotating planets are translated in a circular orbit about a central rotational axis during deposition. Translation and rotation of a substrate in this system exposes different areas of its receiving surface to different precursor concentrations and energies in a given source distribution profile of precursors, thereby providing substantially similar average fluxes of precursors over a selected deposition time to all areas of a substrate surface. Use of substrate positioning systems, such as planetary systems, has been demonstrated to generate thin films having enhanced spatial uniformity with respect to the thickness, composition and morphology of deposited layers.

In addition to the need for good uniformity, the utility of thin film deposition fabrication methods in many applications is also critically dependent on the capability of these techniques to generate thin films and multilayer structures having precisely selected thicknesses and chemical compositions. For example, the optical properties of thin film optical components, such as optical interference filters and antireflection coatings, strongly depends on the physical thicknesses, refractive indices and compositions of individual layers comprising a multilayer optical device. Fabrication methods for making multilayer optical devices having stringent optical specifications, therefore, require accurate and sensitive means for evaluating deposition conditions for determining when a desired thickness of a component thin film layer is achieved and, thus, deposition of a subsequent thin film layer is to be commenced. As a result of these requirements a number of techniques have been developed over the last several decades to monitor and control physical and chemical properties of deposited thin films during thin film deposition, such as the thicknesses of deposited thin film layers and their chemical composition and optical thickness.

The average flux of precursors provided by many thin film deposition systems, such as those employing sputtering sources and evaporation sources, undergoes significant variations during deposition of a thin film. Therefore, fabrication methods for making thin film devices having stringent device tolerances require accurate means of monitoring the flux of precursor materials to a substrate in real time. In a conventional thin film deposition system, the flux of precursor materials is usually determined using a fixed position sensor, such as a quartz crystal microbalance sensor or an optical monitor. Quartz crystal monitoring is an almost universally applicable technique of determining the mass of deposited material, which may be used to determine average layer thicknesses via calibration. In contrast to crystal monitoring, optical techniques do not provide a direct measurement of physical properties (e.g. mass or physical thickness) of the deposited layers. Rather, optical monitoring techniques detect the temporal evolution of light transmitted, scattered and/or reflected from a substrate surface having deposited layers, which may be related to thin film thickness, refractive index and composition. The temporal evolution of transmitted, scattered and/or reflected light in these systems, however, also depends significantly on the structure and optical properties of underlying materials beneath the thin film layer being deposited. For example, in situations where a thin film layer is deposited on top of a pre-existing structure of uncertain physical dimensions, composition or optical properties optical monitoring does not provide useful information in all cases. Even in the case of deposition of a thin film layer on an uncoated, well defined substrate surface, layer thickness errors from optical monitoring can oscillate out of control, and optically insensitive layers can lead to layer thickness errors that become important when an entire structure is complete. Finally, optical monitoring is often susceptible to problems associated with substrate heating and etalon effects in a given optical system. Optical monitoring also fails when appropriate light sources and detection systems are not available.

Due to the drawbacks associated with optical monitoring and the near universal applicability of crystal monitoring, crystal monitoring techniques are preferred for thin film deposition in many device fabrication applications. Quartz crystal monitoring as currently practiced, however, does not provide a direct measurement of the mass of materials actually deposited on a substrate. Rather, this technique provides a measurement of the mass of material deposited on a sensing surface of the crystal sensor. As a result of this experimental limitation, conventional crystal monitoring techniques typically employ a fixed position crystal monitor at a location proximate to the substrate surface undergoing deposition. This configuration is intended to provide measurements at the sensing surface of the monitor which may be related to actual deposition conditions at the substrate. Use of a fixed position crystal monitor, therefore, typically requires an experimental determination of the ratio of the deposition rates at the sensing surface of a fixed position quartz monitor and at the receiving surface of the substrate. This ratio, commonly referred to as the parts-to-monitor ratio, is used to convert real time measurements of the mass of material deposited on the crystal to measurements of the mass of material actually deposited on the substrate.

The source distribution profile of precursors near the substrate surface provided by many thin film deposition sources is also known to undergo variation during deposition of a thin film. These variations may be significant and typically result from changes in the operating conditions of the thin film deposition source, such as variations in ion beam intensity or target erosion in sputtering sources or variations in temperature, pressure or composition of a sample undergoing evaporation in evaporation sources. As the ratio of the deposition rates at the sensing surface of a fixed position quartz monitor and at the receiving surface of the substrate is sensitive to variations in the source distribution profile of precursors, the parts-to-monitor ratio under many experimental conditions is subject to drift during deposition of a thin film layer or during deposition of subsequent thin film layers. This drift results in layer thickness errors which can significantly degrade the quality and/or performance of thin film devices and device components fabricated via thin film deposition methods.

Alternative approaches of using crystal monitoring techniques to improve the uniformity of thin films fabricated via thin film deposition have been developed in recent years. U.S. Pat. No. 4,858,556 provides a description of a method for generating thin films employing an in situ mobile source processing monitor. In the reported technique, the "amplitude and shape" of a physical thin film deposition source is characterized "just prior to substrate processing" and this information is then used to determine "the non-linear motion scenario that is required to achieve processing of specified uniformity over a specified area." Although the methods and devices described in U.S. Pat. No. 4,858,556 are alleged to address problems arising in "processing where source distribution profiles often vary substantially from run to run," these techniques remain susceptible to variations in the source distribution profile of precursors occurring during deposition of a thin film layer (i.e. variations during a run, as opposed to variations from run to run). In addition, these methods require derivation of complex mathematical relationships relating a measured source distribution profile of precursors to motion scenarios of substrates required to achieve good uniformity. Mobile source processing monitor configurations described in U.S. Pat. No. 4,858,556 are limited to embodiments using "a sliding contact electrical interface 152 (FIG. 7)" which makes complex monitor trajectories, such as dual rotation trajectories, impractical and/or unfeasible. Furthermore, systems provided include mobile sensors consisting of only a crystal connecting the crystal electronically to external circuitry for reading the crystal frequency via the sliding or rotating electrical contacts. It is very difficult to control the stability of the electrical sensing circuitry in this arrangement due to anticipated changes in conductivity, capacitance, resistance and impedance upon rotation or sliding motion of the electrical contacts. Therefore, this arrangement is expected to be susceptible to substantial errors in the measured layer thicknesses arising from the sliding or rotating electrical contacts. Moreover, the configurations disclosed in this reference are not amenable to high-throughput fabrication applications.

It will be appreciated from the foregoing that there is currently a need in the art for methods and devices for monitoring and controlling thin film processing via thin film deposition. Particularly, devices and methods for monitoring and controlling thin film deposition are needed that are capable of measuring and accounting for changes in the average fluxes and source distribution profiles of precursors generated by thin film deposition sources that occur during deposition of a thin film layer and subsequent thin film layers. In addition, thin film deposition methods are needed that are capable of gen-

SUMMARY OF THE INVENTION

The present invention provides thin film processing systems for fabricating thin films and devices comprising thin films having accurate thin film layer control with respect to the physical thickness, thickness profile, chemical composition and physical characteristics of deposited thin film layers. The present invention comprises thin film processing methods and devices for depositing precursors onto a substrate that are capable of generating thin film layers and multilayer structures comprising thin film layers having accurately selected physical thicknesses, thickness profiles, chemical compositions and physical properties. Thin film processing monitoring systems and methods are provided that provide real time, in situ measurements of the mass, physical thickness, refractive index, optical thickness, surface morphology and/or electrical charge characteristics of a thin film layer deposited onto a sensor undergoing translation and/or rotation that is substantially coincident with the translation and/or rotation of a substrate in a flux region of a thin film processing system. The present invention also provides thin film layer monitoring and control methods for making single layer and multilayer structures comprising thin film layers having spatially uniform physical thicknesses or thin film layers having selected non-uniform thickness profiles with improved accuracy and precision relative to conventional thin film processing systems. Further, methods and systems of the present invention eliminate reliance on characterization of a parts-to-monitor ratio. Methods and systems of the present invention employing an onboard sensor with supporting electrical circuitry and having a wireless transmitter are capable of providing measurements of processing characteristics representative of thin film processing on a substrate surface while moving in a flux region of a thin film processing system along virtually any trajectory including complex trajectories substantially coincident with the trajectories of one or more substrates in a planetary system, such as a dual rotation planetary system.

In one aspect, thin film processing systems and methods are provided having a moving deposition sensor capable of translation and/or rotation in a manner that exposes the sensor to thin film deposition environments in a flux region substantially the same as the deposition environments experienced by one or more moveable substrates during a selected deposition period. In one embodiment, systems and methods are provided wherein a deposition sensor is translated and/or rotated in a manner such that the net amount and/or physical properties of precursors deposited onto a sensing surface per area of the sensing surface are substantially the same as the net amount of precursors deposited onto a receiving surface of substrate per receiving surface area that is translated and/or rotated in the flux region of a thin film deposition system. In another embodiment, a system is provided wherein one or more moveable substrates and a moveable deposition sensor are moved along substantially coincident trajectories in a flux region of a thin film deposition system for a selected deposition period. In yet another embodiment, systems and methods are provided wherein a deposition sensor is positioned, translated and/or rotated in a flux region in a manner providing an average flux of precursors deposited onto a sensing surface for a selected deposition period that is substantially equal to the average flux of precursors deposited onto a receiving surface of a translating and/or rotating substrate undergoing thin film processing via thin film deposition.

In one embodiment of this aspect of the present invention, systems and methods for fabricating a thin film layer having a spatially uniform physical thickness are provided having a rotating sensor that is capable of movement along a trajectory in the flux region of a thin film processing system that is substantially coincident with the trajectory of one or more substrates undergoing rotation and translation during thin film processing. A device of the present invention for depositing particles on the receiving surface of a substrate comprises a thin film deposition source for generating a flux of particles in a flux region, a rotating substrate having a receiving surface, a means for translating the rotating substrate in the flux region, a rotating deposition sensor having a sensing surface, and a means of translating the sensor in the flux region. Rotation of the substrate is provided by a means for rotating the substrate that rotates the receiving surface about a first rotational axis, and rotation of the sensor is provided by a means for rotating the sensor that rotates the sensing surface about a second rotational axis. In this embodiment of the present invention, rotation and translation of the substrate moves the receiving surface along a receiving surface trajectory in the flux region, and rotation and translation of the sensor moves the sensing surface along a trajectory in the flux region that is substantially coincident with the receiving surface trajectory. Sensors useful in this embodiment of the present invention are capable of measuring the mass, optical thickness, temperature, electric charge, composition or morphology of a thin film layer deposited on the sensing surface of the sensor or any combination of these parameters. Optionally, systems and methods of this aspect of the invention may further comprise one or more source distribution-modifying elements, such as shadow masks, positioned in the flux region between substrates undergoing processing and a thin film deposition source. Source distribution-modifying elements of the present invention are capable of selectively adjusting the distribution of precursors that are exposed to one or more substrates undergoing thin film processing.

Movement of a substrate in a flux region as it undergoes thin film processing exposes different regions of a receiving surface of the substrate to different precursor concentrations in a source distribution profile of precursors generated by a thin film deposition source. In the present invention, the combination of rotation of a substrate about a first rotational axis and translation of the rotating substrate in the flux region is used to generate spatially uniform thin films on a receiving surface of a substrate despite inhomogeniety in the source distribution profile of precursors generated by most thin film deposition sources. Particularly, rotation and translation of the substrate exposes each point on the receiving surface to substantially similar net deposition conditions, concentrations and translational energies of precursors, during a selected deposition time. Over a selected deposition period that is short relative to the time scale of fluctuations of the source distribution, this configuration provides substantially similar average fluxes of precursors to each point of a receiving surface of the substrate, thereby generating a thin film layer on the receiving surface having enhanced uniformity with respect to physical thickness, mass and composition.

In the present invention, a sensor is also provided in the flux region of a thin film deposition source, and is rotated about a second rotation axis and translated in the flux region provided by a thin film deposition source such that during a given deposition period a sensing surface of the sensor is exposed to substantially identical net deposition conditions as the rotating and translating substrate undergoing thin film processing.

Exposure of the sensor to substantially identical net deposition conditions, for example, can involve positioning the sensor in the same regions of a source distribution of precursor as a substrate undergoing processing for the same time intervals. This configuration provides substantially the same fluxes of precursors to the sensing surface and substrate(s) undergoing thin film processing. In one embodiment, this is achieved by providing a combination of rotational and translational motion of the sensor such that the sensing surface of the sensor is moved along a trajectory in the flux region that is substantially coincident with the trajectory that the substrate makes during deposition of a thin film. An advantage of this feature of the present invention is that the deposition conditions monitored by the sensor can be directly related to the actual deposition conditions governing thin film formation on the substrate without the need for characterizing a parts-to-monitor ratio or assuming a constant source distribution of precursors. As a result, thin film deposition systems of the present invention are useful for providing real time measurements of physical and chemical properties of thin films deposited on a substrate surface that are sensitive to changes in the source distribution profile of precursors that occur during deposition. Therefore, thin film deposition systems and methods of the present invention are capable of generating spatially uniform thin films with precisely selected physical thickness or thin films having a selected, non-uniform thickness profile using thin film deposition source having source distributions of precursors that are subject to variation during deposition. This feature of the present invention provides a significant improvement over conventional thin film deposition systems employing a fixed position sensor, which are susceptible to significant thickness errors due to variations in the source distribution of precursors during deposition of a thin film.

In some embodiments of this aspect of the present invention, one or more source distribution-modifying elements are provided in the flux region between the thin film deposition source and the rotating and/or translating substrates undergoing processing (and also rotating and/or translating sensor). For example, the present invention includes embodiments having one or more source distribution-modifying elements comprising shadow masks which are capable of at least partially preventing the passage of some of the precursors as it passes through a particular region with a particular flux gradient and a particular orientation with respect to this gradient. Typically, shadow masks comprise plates or grids made of materials, such as metals or plastics, that at least partially prevent the transmission of precursors. The shapes and physical dimensions of shadow masks, such as surface area presented to the thin film deposition source and thickness, depend on the source distribution profile of precursors generated by a given thin film deposition source. As a result of their characteristic to partially or entirely prevent transmission of precursors from a deposition source to a substrate undergoing processing, incorporation of a shadow mask into the systems of the present invention modifies a source distribution profile of precursors that are exposed to substrates undergoing processing. The modified source distribution profile of precursors is characterized by processing regions wherein the flux of precursors is partially or entirely attenuated. Selective manipulation of the source distribution profile of precursors exposed to one or more substrates undergoing processing using source distribution-modifying elements, such as shadow masks, is particularly useful in the present invention for generating thin film structures having spatially uniform physical thicknesses and selected nonuniform thickness profiles. The present invention includes systems and methods, however, wherein source distribution-modifying elements, such as shadow masks, are used to fabricate thin film structures having a selected, non-uniform thickness profile on a receiving surface, such as spatially-chirped structures.

Systems and methods of the present invention may employ a single shadow mask or may include a plurality of shadow masks. In systems and methods useful for making multilayer structures and devices employing a sputtering thin film deposition source, shadow masks having different physical dimensions and/or compositions can be provided for each target material used during fabrication. The present invention also includes systems and methods using one or more dynamic shadow masks capable of selectively adjusting (or tuning) the source distribution of precursors exposed to substrates undergoing processing. Some dynamic shadow masks, for example, are capable of selective adjustment of their physical dimensions, such as surface area presented to a thin film deposition source, and/or position in a flux region so as to provide a selected source distribution of precursors exposed to a substrate.

In some embodiments, use of a shadow mask is beneficial for achieving thin films exhibiting uniform physical thicknesses across an entire area of a receiving surface of a substrate. Such embodiments may additionally provide good uniformity with respect to the physical thicknesses of thin films deposited on a plurality of substrates undergoing simultaneous processing. In some aspects, incorporation of a shadow mask is useful for providing substantially equivalent average fluxes of precursors to the receiving surfaces of rotating and/or translating substrates (and sensors) having different trajectories in a flux region. For example, use of one or more shadow masks in the present invention provides a means of establishing substantially equivalent average fluxes of precursors for a selected deposition time to rotating and/or translating substrates (and sensors) positioned on one or more sub-planets of a dual rotation planetary system, particularly substrates (and sensors) provided in different radial positions with respect to the rotational axis of one or more sub-planets. In the present invention, use of source distribution-modifying elements, such as shadow masks, in combination with single and multiple rotation planetary systems, such as single and dual rotation planetary systems, provides an effective high-throughput means of simultaneously fabricating equivalent thin film structures having accurately selected physical thicknesses on a plurality of substrates.

Motion of substrates and deposition sensors in the flux region may be periodic in the present invention. In one embodiment, for example, one or more rotating substrates and the rotating sensor are repeatedly moved through substantially the same cyclic trajectory at substantially the same rate of rotation and/or translation for a plurality of movement cycles each of which comprises a complete, cyclic trajectory. While substrates and the sensor move along the same trajectory in this embodiment of the present invention, each rotating and/or translating component begins motion at a different starting position and, therefore, different translating and/or rotating components never occupy the same position at the same time because these components move along the same cyclic trajectory at the same velocity. An advantage of this motion scenario of substrates and sensors of the present invention, is that use of large translational and rotational velocities and relatively low deposition rates results in completion of a large number of cyclic trajectories during deposition of a thin film, thereby providing substantially the same net paths in the flux region and net deposition conditions for all translating and or rotating components. Alternatively, the present invention also includes embodiments wherein the motion of substrates and deposition sensors in the flux region is aperiodic. In this embodiment, the time scale over which the averaged flux on the substrate(s) and sensor(s) are effectively the same and are short compared to the time scales over which physical properties (e.g. flux distribution, distribution of energies, spatial distribution) of the source changes.

In the present invention, rotation and translation of substrates and deposition sensors may be provided by any means known in the art. In exemplary embodiments, rotation and translation of these components is provided by a planetary system, such as single planet and multiple planet rotation systems. For example, a device of the present invention further comprises a dual rotation planetary system, wherein one or more substrates and the deposition sensor(s) are affixed to sub-planets of the system for translating and rotating these components in the flux region of a thin film deposition system. In one embodiment, the substrate(s) and the sensor(s) are independently rotated about first and second rotational axis (i.e. the rotational axes of subplanets having the sensor and substrate), respectively, by affixing these moveable components to different sub-planets of a dual rotating planetary system. Individual sub-planets are affixed to a central planet of the dual rotation planetary system such that rotation of the central planet moves the rotating substrate and the rotating sensor in substantially the same orbit about a central rotational axis of the dual rotation planetary system. In an embodiment of the present invention, first and second rotational axes are positioned the same distance from the central rotational axis, and the receiving surface of the substrate is positioned a distance from the first rotational axis equal to the distance that the sensing surface of the sensor is positioned from the second rotational axis. The present invention includes embodiments wherein additional substrates are positioned on a single sub-planet and embodiments wherein additional substrates are positioned on additional sub-planets rotating about additional rotational axis positioned at about the same distance from the central axis as the first and second rotational axes. Use of a dual planetary system in the present invention is particularly useful for fabricating spatially uniform thin films having accurately selected physical thicknesses, chemical compositions and physical properties. Moreover, embodiments of the present invention using a dual rotation planetary system are capable of high throughput thin film processing compatible with commercial scale device fabrication applications.

Alternatively, the present invention includes embodiments wherein substrates and sensor(s) are affixed to the central planet of a single rotation planetary system. The system is configured such that rotation of the central planet rotates the substrates and sensor(s) about orbits characterized by their individual rotational positions with respect to the central rotational axis of the central planet. Methods and systems of this aspect of the present invention may further comprise one or more shadow masks for providing a selected distribution of precursors at the receiving surfaces of the substrates and sensing surface of the sensor. In one embodiment, sensors are provided at radial positions with respect to the central rotational axis equal to the radial positions of substrates undergoing processing. In another embodiment, sensors may also be provided in a manner such that they rotate about a second rotational axis, such as a rotation axis which passes through the center of the sensing surface, during processing to ensure that their sensor surfaces are coated with a thin film having a spatially uniform thickness profile. Methods and systems of the present invention using a single rotational planetary system have the advantage of requiring a very simple experimental set up for providing rotation of the substrates undergoing processing.

In another embodiment of this aspect of the present invention, systems and methods for fabricating a thin film having a uniform physical thickness profile are provided employing a deposition sensor having a wireless transmitter. A device of the present invention for depositing particles on the receiving surface of a substrate comprises a thin film deposition source for generating a flux of particles in a flux region, a substrate having a receiving surface, a means for translating the substrate in the flux region, a sensor comprising a sensing surface for receiving the flux of particles and a wireless transmitter for generating an output signal corresponding to a measurement made by the sensor; a means for translating the sensor in the flux region, and a receiver for receiving the output signal generated by the transmitter. In this embodiment of the present invention, the means for translating the substrate translates the receiving surface along a receiving surface trajectory in the flux region, and the means for translating the sensor moves the sensing surface along a sensing surface trajectory in said flux region that is substantially coincident with the receiving surface trajectory. This embodiment of the present invention may further comprise a thin film deposition source controller in communication with the receiver for receiving the output signal and controlling operating conditions of device components of a thin film deposition system such as the thin film deposition source, shadow mask orientation, target angle, and vacuum chamber geometry. Optionally, substrates and/or deposition sensors of this embodiment of the present invention may also be provided with means for rotating these elements during translation in the flux region.

In one embodiment, the sensor and/or wireless transmitter is self powered, for example using a battery power supply, mechanical power source such as an induction coil or onboard magnetic power source. The present invention includes sensors and/or wireless transmitters that are externally powered via a wireless connection, such as sensors and/or wireless transmitters that are powered radiatively or magnetically. Use of a wireless transmitter that is self powered via an onboard power source such as a battery or powered wireless connection is beneficial in the present invention because it eliminates the need for maintaining direct electrical contact with measurement circuitry, power supplies and/or a thin film deposition system controller, which are typically located outside a vacuum deposition chamber housing the thin film deposition source, substrate undergoing processing and deposition monitor. This feature of the present invention has important practical significance with respect to the design and operation of thin film deposition systems and methods of using thin film deposition systems of the present invention. First, elimination of the need for direct electrical contact with the deposition sensor greatly simplifies the design of systems of the present invention because output signals may be transmitted from the sensor and power may be conducted to the sensor when it is moving and/or positioned in any orientation in a flux region of a thin film deposition system. Second, elimination of the need for direct electrical contact with the deposition sensor allows deposition sensor configurations capable of movement along virtually any trajectory in the flux region of a thin film deposition system. Third, use of a wireless transmitter permits substrate and sensor trajectories to be provided using conventional mechanical means compatible with high throughput fabrication, such as single stage and multiple stage rotating planetary systems. Fourth, use of a wireless transmitter in the present invention provides a means of continuous communication with a receiver, thereby allowing continuous data transmission to a receiver at high transmission rates. Finally, use of on board, isolated circuitry for reading and transmitting sensor readings, such as the frequency of a quartz crystal microbalance, is significantly less susceptible to noise and electrical fluctuations, such as fluctuations in capacitance, conductance, resistance and impedance, than sliding contact or rotating contact orientations.

Wireless transmitters useful for the thin film deposition systems and methods of the present invention comprise any device or device component capable of transmitting an output signal from the deposition environment of the sensor and substrate, such as a vacuum chamber, to a receiver, additional measurement circuitry and/or a thin film deposition controller without use of direct electrical contact (e.g. a wire, brushes or equivalent sliding or transient electrical connectors). In some embodiments, the wireless transmitter is an optical element capable of generating an output signal comprising electromagnetic radiation having selected frequencies and amplitudes, such as radio frequency waves, infrared light or visible light, which is received by a fixed receiver, which is positioned outside the deposition environment. Receivers useful in this aspect of the present invention may comprise antenna and photosensors, such as photodiodes, thermal type infrared detectors, semiconductor type detectors, photoconductive detectors, and photomultipliers. Wireless transmitters preferred for some applications have low spurious emissions, have low power/current consumption requirements and high frequency stability and are capable of fast data transmission rates. Wireless transmitters and receivers of the present invention are optionally capable of multichannel transmission and reception. In a preferred embodiment providing multichannel capability, wireless transmitters and receivers are operated such that cross talk is avoided, for example via encoding means well known in the art of wireless transmission.

In another aspect, the present invention provides thin film layer monitoring and control methods for determining deposition times and/or thin film deposition source operating conditions in a thin film deposition system. Methods of this embodiment of the present invention measure physical and/or chemical characteristics of a thin film deposited on a sensing surface of a movable sensor that is moved along a trajectory in a flux region of a thin film deposition system that is substantially coincident with the trajectory of one or more movable substrates undergoing thin film processing. As the movable sensor undergoes a substantially coincident trajectory, the measurements provided may be directly related to the physical and chemical properties of thin films actually deposited on the substrates. In one embodiment, measurements are carried out in real time by a movable sensor in a continuous manner and transmitted continuously to a receiver and/or thin film deposition controller for data processing, analysis and control of the process. Alternatively, the present invention also includes embodiments wherein measurements are periodically or aperiodically carried out at discrete and selected deposition times and subsequently transmitted to a receiver and/or thin film deposition controller for data processing, analysis and control of the process.

In one embodiment of the present invention, measurements are continuously, periodically or aperiodically obtained during deposition of a thin film, analyzed in real time and used to determine when a deposited thin film has achieved a selected physical thickness and/or optical thickness. For example, the present invention includes methods wherein the mass of a thin film deposited on the sensing surface of a sensor undergoing a trajectory substantially coincident with the trajectory of receiving surfaces of substrates undergoing thin film processing is measured. Measurements are acquired in real time and used to calculate the physical thickness of thin films deposited on the substrates moving in the flux region. This calculation takes into account the expected density of the deposited thin film and as well the surface area of the sensing surface. The calculated physical thickness is compared to a preselected thickness, and used to control the exposure time of the substrate(s) to precursors in the thin film deposition system. For example, upon determining a physical thickness equal to or larger than the preselected thickness, operating conditions in the thin film deposition system are adjusted to stop deposition on the receiving surfaces of substrates undergoing processing. This can be accomplished by adjusting the operating conditions of the thin film deposition source itself, for example by stopping an ion beam or electron beam in a sputtering thin film deposition source, or by introducing a shutter, barrier or mask between the thin film deposition source and the substrates that prevents transmission of precursors to the substrate. Alternatively, the present invention also includes embodiments wherein the optical thickness of a thin film deposited on a sensing surface of a sensor undergoing a trajectory substantially coincident with the trajectory of receiving surfaces of substrates undergoing thin film processing is continuously, periodically or aperiodically measured, compared to a preselected optical thickness, and used to control the exposure times of one or more substrate to precursors. Thin film monitoring and control methods of the present invention allow the physical thickness of a thin film to be selected to within about 0.3% for high-throughput applications. This constitutes an improvement in thickness control over conventional thickness control methods using a fixed position sensor equal to about a factor of 10.

In an embodiment useful for fabrication of multilayer structures, measurements of the mass and/or optical thickness of a deposited thin film are used to determine when thin film deposition conditions are to be selectively adjusted to initiate deposition of an additional layer on top of a previously deposited layer. For example, when a measured or calculated physical or optical thickness of a first thin film layer having a selected first composition is determined to be equal to or greater than a preselected value, operating conditions of the thin film deposition source is adjusted to initiate deposition of an additional thin film layer having a selected second composition on top of the first thin film layer. This can be accomplished, for example, by changing the target material in a sputtering source or by changing the material undergoing evaporation in an evaporation source. In this manner, complex structures may be fabricated using the present techniques comprising discrete thin film layers having well defined and accurate selected physical thicknesses and chemical compositions selected with great accuracy. Use of the thin film layer monitoring and control methods of the present invention for making multilayer structures comprising thin films is beneficial because these methods provide real time measurements of thin film properties that do not rely on maintaining a constant source distribution profile of precursors or characterization of a parts-to-monitor ratio prior to or after thin film processing. Therefore, in contrast to conventional thickness monitoring and control methods using a fixed position sensor, the methods of the present invention are not limited by uncertainties in the source distribution profile of precursors.

In another embodiment of the present invention, measurements of the physical and/or chemical characteristics of a thin film deposited on a sensing surface of a sensor moving along a trajectory in the flux region of a thin film deposition system substantially coincident with the trajectories of one or more moving substrates undergoing processing is used to provide closed loop feedback control of a physical thin film deposition source. The present invention provides methods, for example, wherein successive determinations of the physical thickness or mass of a deposited thin film are used to determine an average observed flux of precursors to the receiving surface for a given deposition period. The average observed flux is compared to a preselected flux value, and deviations from the preselected flux value serve the basis of control signals that are used to selectively adjust the thin film deposition source in a manner establishing and/or maintaining a flux to the receiving surface equal or within a certain range of the preselected flux value. In an exemplary embodiment, this control process is cyclically repeated throughout a deposition period. Alternatively, the present invention includes methods wherein measurements of the morphology, such as roughness, density, physical state (crystalline, amorphous, semicrystalline), extent of crystallinity, and/or refractive index of a thin film layer deposited on the sensing surface is measured and used to control operating conditions in a manner to optimize a thin film layer morphology and/or refractive index for a given device fabrication application. In this aspect of the present invention, adjustment of the thin film deposition source on the basis of control signals may be achieved by any means known in the art including selective adjustment of the intensity of an ion beam or electron beam in a sputtering source, selective adjustment of the temperature in an evaporation source, or selective adjustment of the pressure (net pressure and/or partial pressure of oxygen or other bath gas) or temperature in the deposition chamber. The methods of the present invention may also be used to control the average flux of precursors and/or the source distribution of precursors provided by a thin film deposition source Sensors useful in the present invention provide measurements of properties of thin film layers deposited on a sensing surface including physical characteristics such as physical thickness, mass, density, morphology (density, physical state, extent of crystallinity), optical characteristics such as refractive index and optical thickness, chemical characteristics such as chemical composition and purity, and electrical characteristics such as accumulated electric charge, capacitance, resistance, magnetic hall effect and conductivity. Sensors of the present invention are capable of characterizing a thin film layer deposited directly on a bare receiving surface of a substrate and/or a thin film layer deposited on an underlying multilayer structure existing on a substrate. Useful sensors in the present methods include, but are not limited to, crystal sensors such as quartz crystal microbalance sensors, optical sensors such as single and dual beam optical interference sensors, temperature sensors such as thermocouples and thermopiles, and sensors for measuring charge accumulation on thin film surface such as an electrometer. Sensors useful in the present invention also include position and motion sensors such as accelerometers and optical position sensors. Sensing surfaces of the present invention include flat surfaces and contoured surfaces, such as, curved, convex and/or concave surfaces. Use of contoured sensing surfaces is useful in applications of the present invention for processing substrates also having contoured surfaces. In these embodiments, it is often desirable to utilize a contoured sensing surface characterized by the same shape, such as radius of curvature, as a contoured substrate surface undergoing processing. For example, use of a sensor having a contoured surface is useful for depositing one or more thin films on the surface of a lens.

An advantage of embodiments of the present invention having a rotating quartz microbalance sensor positioned in a flux region is that rotation of the sensing surface during deposition generates a thin film on the sensing surface that has a spatially uniform thickness profile. Thickness uniformity of the thin film layer deposited on the sensing surface of the quartz crystal microbalance provides a more reliable measurement of the mass of material deposited on the sensing surface because such spatially uniform thin film layers generate an isotropic distribution of stresses on the crystal surface. In contrast, deposition of thin films having a non-uniform thickness profile on the sensing surface of a quartz crystal microbalance generates anisotropic stress that can affect different crystal axis and crystal defect sites differently, thereby introducing uncertainties in the mass measurements provided under these conditions.

The present invention also includes embodiments wherein the sensor positioned and moved in the flux region of a thin film deposition system is capable of simultaneously or near simultaneously measuring a plurality of different thin film characteristics. In one embodiment, for example, the moveable sensor comprises a plurality of discrete, independent sensors each of which is configured to make a different thin film measurement in real time. Sensors of this embodiment can have a plurality of independent sensing surfaces or have a single sensing surface for making a plurality of measurements. Use of sensors capable of measuring a plurality of thin film characteristics is preferred for some device fabrication applications because it can provide a more comprehensive and detailed picture of thin film deposition conditions, thereby enabling control methods and systems for fabricating thin film layers having a plurality of accurately selected physical thicknesses, optical properties and/or chemical characteristics. Further, measurement of a suite of different thin film characteristics provides complementary measurements useful for extracting more accurate thin film information. For example, temperature measurements may be used to correct additional measurements of thin film properties, such as quartz crystal microbalance mass measurements and optical measurements, that exhibit temperature dependence arising from temperature dependent sensors themselves, changes in the temperature of a deposited film or temperature dependent measurement circuitry.

The present invention also includes embodiments wherein a sensor array is provided and moved along a trajectory that is substantially coincident with the trajectories of one or more receiving surfaces of substrates undergoing thin film processing, thereby providing a plurality of measurements of one or more thin film characteristics corresponding to different sensor or sensing surface positions. Sensor arrays may comprise a single device having a plurality of independent sensing surfaces located at different relative positions or may comprise a plurality of independent sensors located at different relative positions. For example, an embodiment of the present invention provides a sensor array on a sub-planet of a dual rotation planetary system that rotates about a rotational axis. In this configuration the sensor array provides a plurality of independent sensing surfaces or independent sensors which provide measurements of one or more thin film characteristics, such as the mass or optical thickness of deposited material, which corresponds to different distances from the rotation axis of the sub-planet carrying the sensor array. Thin film layer monitoring and control methods employing a sensor array are useful for some device fabrication applications because the physical thicknesses of thin film layers on a plurality of substrates or positions on a single substrate moving along different trajectories in a flux region of a thin film deposition system can be simultaneously monitored in real time.

Rotating and/or translating substrates and deposition sensors of the present invention may be moved along virtually any trajectory resulting in deposition of a thin film. This aspect of the present invention is particularly true of embodiments employing a sensor having a wireless transmitter that eliminates the need of maintaining electrical contact during movement of the sensor. Methods and systems of the present invention include embodiments wherein the trajectory of rotating and/or translating substrates and deposition sensors is entirely within the flux region of a thin film deposition system. Alternatively, the present invention includes embodiments wherein the trajectory of rotating and/or translating substrates and deposition sensors intermittently passes through a flux region of a thin film deposition system. Trajectories useful in the present invention include a variety of types of motion including rotational motion about a single rotational axis, rotational motion about a plurality of rotational axes, circular orbital motion, elliptical orbital motion, parabolic motion, linear motion and any combination of these or non-repetitive motions as determined by analysis of the sensor data themselves.

Thin film layer monitoring and control methods of the present invention are applicable to any type of deposition source, including physical thin film deposition sources and chemical thin film deposition sources. Deposition sources useful in the present methods may have any source distribution profile of precursors including, homogeneous source profiles, inhomogeneous source profiles, Gaussian source profiles, Lorentzian source profiles, elliptical source profiles, square wave source profiles and any combination of these, for example.

The thickness monitoring and control methods of the present invention are equally applicable to systems, methods and processes for removing material from a substrate surface or coated substrate surface, such as chemical etching, ion beam etching and electron beam etching processes. In one embodiment, a sensor is provided comprising a sensing surface having an exposed coating comprising a thin film layer of a selected material. Substrates undergoing material removal and the sensor having a coated sensing surface are moved along substantially coincident trajectories in a material removal region, such as a region having chemical etchants present. Continuous, periodic or aperiodic measurements of the mass of the exposed thin film layer on the sensing surface, for example, may be used to provide measurements of the amount of material removed from the sensing surface at a given time and the average rate of material removal for a given time interval. If the trajectories of the sensor and substrate are substantially coincident, these measurements may be directly related to material removal processes occurring on the substrate surface themselves. This process may be used, therefore, to control exposure times of the substrates to etchants needed to achieve a desired extent of material removal or a desired physical thickness of a substrate or thin film on a substrate. The present methods may also be used to assess chemical or physical changes of thin films undergoing thin film processing, such as thin films undergoing annealing or doping processing steps.

The thin film deposition systems and methods of the present invention are applicable to a wide range of thin film deposition systems, including ion beam and magnetron sputtering systems, chemical thin film deposition systems, and electron beam and thermal evaporation deposition systems. The present devices and methods are applicable to processing semiconductor materials by controlling doping and/or ion implantation process steps. The methods and devices of the present invention may be used to fabricate thin films and multilayer structures comprising a wide range of materials, such as dielectric materials such as metal oxides, metalloid oxides and salts, semiconductors, conductors such as metals and metalloids, and materials such as polymers. Methods and devices of the present invention may be used to fabricate a variety of thin film optical devices including, but not limited to, Fabry Perot elatons, multicavity optical interference filters, lenses, lens coatings, antireflection coatings, partially reflective reflectors, highly reflective reflectors, polarization selective coatings, and phase adjustment coatings. Additionally, the methods and devices of the present invention are also applicable to fabrication of a wide variety of other thin film devices including, semiconductor devices, integrated electronic circuits, and microelectronic devices such as thin film transistors, nanoelectronic devices, microfluidic and nanofluidic systems, light emitting diodes, photodiodes, organic light emitting diodes, and field effect transistors.

The reduction of errors in process control by monitoring the deposition on a path that is substantially coincident with the path of the parts to be coated enables further reduction of errors that would be obscured by larger errors caused by the time-variation of the part-monitor ratio in a system based on a fixed monitor. This invention describes further reduction in errors in layer thickness control, by combining a quartz crystal monitor that follows a path that is substantially coincident with the path of the parts, with further improvements of film thickness measurements based on using a temperature-compensated SC-cut quartz crystal microbalance. An electrical circuit is described that performs the frequency measurement of two or several modes of oscillation of the crystal.

In another aspect, the present invention comprises a method for monitoring processing of a thin film on a substrate comprising the steps of: (a) providing a thin film deposition source for generating a flux of precursors in a flux region; (b) providing a substrate having a receiving surface for receiving the precursors; (c) providing a sensor having a sensing surface for receiving the precursors; (d) rotating the substrate about a first rotational axis; (e) rotating the sensor about a second rotational axis; (f), translating the rotating substrate in the flux region, wherein rotation and translation of the substrate moves the receiving surface along a receiving surface trajectory in the flux region; (g) translating the rotating sensor in the flux region, wherein rotation and translation of the sensor moves the sensing surface along a trajectory in the flux region that is substantially coincident to the receiving surface trajectory; and (h) making a measurement of a physical or chemical property of a thin film on the sensing surface of the sensor, thereby monitoring processing of the thin film on the substrate.

In another aspect, the present invention provides a method for controlling the physical thickness of a thin film deposited on a substrate comprising the steps of: (a) providing a flux of precursors in a flux region; (b) providing a substrate having a receiving surface for receiving the precursors; (c) providing a sensor comprising a sensing surface for receiving the precursors; (d) translating the substrate in the flux region, wherein translation of the substrate moves the receiving surface along a receiving surface trajectory in the flux region; (d) translating the sensor in the flux region, wherein translation of the sensor moves the sensing surface along a trajectory in the flux region that is substantially coincident to the receiving surface trajectory; (e) determining an observed mass of a thin film deposited on the sensing surface of the sensor; (f) calculating a physical thickness of the thin film deposited on the sensing surface corresponding to the observed mass; (g) comparing the calculated physical thickness to a preselected thickness; and (h) stopping the flux of precursors in the flux region when the calculated physical thickness is equal to or greater than the preselected thickness.

In another aspect, the present invention provides a method for controlling the thickness of a thin film deposited on a substrate comprising the steps of: (1) providing a flux of precursors in a flux region, (b) providing a substrate having a receiving surface for receiving the precursors; (c) providing a sensor comprising a sensing surface for receiving the precursors; (d) translating the substrate in the flux region, wherein translation of the substrate moves the receiving surface along a receiving surface trajectory in the flux region; (e) translating the sensor in the flux region, wherein translation of the sensor moves the sensing surface along a trajectory in the flux region that is substantially coincident to the receiving surface trajectory; (f) determining an observed optical thickness of a thin film deposited on the sensing surface of the sensor, (g) comparing the observed optical thickness to a preselected optical thickness; and (h) stopping the flux of precursors in the flux region when the observed optical thickness is equal to or greater than the preselected optical thickness.

In methods of this aspect of the present invention, the step (h) of stopping the flux of precursors to the receiving surface may comprise (i) the step of positioning a shutter between the thin film deposition source and the receiving surface of the substrate, (ii) the step of turning off the thin film deposition source, (iii) the step of turning off the ion beam and (iv) removing the receiving surface from the flux region. Methods of this aspect of the present invention may further comprise the step of providing a shadow mask between the thin film deposition source and the receiving surface of the substrate, and optionally the shadow mask may at least in part establish the source distribution profile of precursors in the flux region.

In another aspect the present invention provides a device for processing a thin film on a substrate, the device comprising: (i) a thin film deposition source for generating a flux of precursors in a flux region; (ii) a means for translating the substrate having a receiving surface for receiving the precursors; wherein translation of the substrates moves the receiving surface along a receiving surface trajectory in the flux region; (iii) a sensor comprising a sensing surface for receiving the precursors and a wireless transmitter for generating an output signal corresponding to a measurement made by the sensor; (iv) a means for translating the sensor, wherein translation of the sensor moves the sensing surface along a sensor trajectory in the flux region that is substantially coincident with the receiving surface trajectory; and (v) a receiver for receiving the output signal. In one embodiment of this aspect of the present invention, rotation and translation of the substrate the sensor results in substantially the same average fluxes of precursors to the receiving surface and the sensing surface for a selected deposition time. In another embodiment of this aspect of the present invention, the receiving surface of the substrate and the sensing surface of the sensor simultaneously receive fluxes of precursors. In another embodiment of this aspect of the present invention, the thin film monitoring and control device further comprises a thin film deposition source controller in communication with the receiver for receiving the output signal, wherein the thin film deposition source controller controls the flux of precursors in the flux region. In another embodiment of this aspect of the present invention, the wireless transmitter generates an output signal comprising infrared radiation, radio waves or both. In another embodiment of this aspect of the present invention, the sensor is a mass sensor for measuring the mass of precursors deposited on the sensing surface, such as a quartz crystal monitor. In another embodiment of this aspect of the present invention, the sensor is selected from the group consisting of: an optical thickness monitor for measuring the optical thickness of a thin film of precursors on the sensing surface; a temperature sensor for measuring the temperature of the sensing surface; a refractive index monitor for measuring the refractive index of a thin film of precursors on the sensing surface; an electrometer for measuring the electric charge of a thin film of precursors on the sensing surface; and an accelerometer for measuring the acceleration of the rotating sensor. In another embodiment of this aspect of the present invention, the means for translating the rotating substrate and the means for translating the rotating sensor comprise a central planet of a dual rotation planetary system, wherein rotation of the central planet moves the rotating substrate and the rotating sensor in an orbit about a central rotational axis of the dual rotation planetary system, wherein the first and second rotational axes are positioned the same distance from the central rotational axis, wherein the means for rotating the substrate is a substrate sub-planet of the dual rotation planetary system, wherein rotation of the substrate sub-planet rotates the receiving surface about the first rotational axis, and wherein the means for rotating the sensor is a sensor sub-planet of the dual rotation planetary system, wherein rotation of the sensor sub-planet rotates the sensing surface about the second rotational axis.

The present invention provides a method for additional reduction of process errors by combining the use of a monitor that follows a path (position and orientation) that is substantially coincident with the path of parts to be processed, thereby eliminating or reducing process errors due to a fluctuating parts-to-monitor ratio, with corrections of the sensor for environmental effects such as temperature and stress.

BRIEF DESCRIPTION OF THE DRAWINGS

FIG. 11A corresponds to deposition control provided by an AT-cut quartz crystal microbalance and FIG. 11B corresponds to deposition control provided by an SC-cut quartz crystal microbalance.

DETAILED DESCRIPTION OF THE INVENTION

Figure 1A:
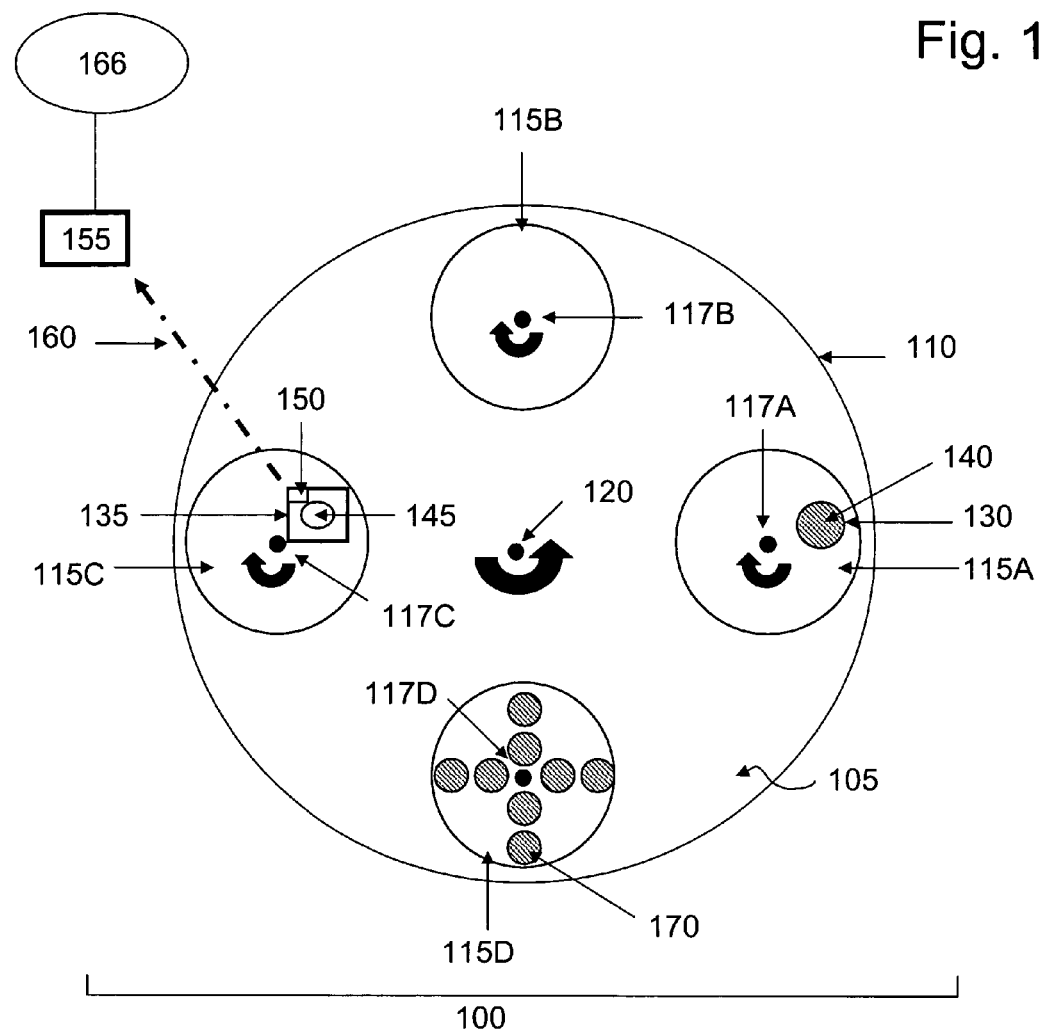
FIG. 1A is a schematic drawing of a thin film layer monitoring system of the present invention employing a dual rotation planetary system.

Referring to the drawings, like numerals indicate like elements and the same number appearing in more than one drawing refers to the same element. In addition, hereinafter, the following definitions apply:

"Source distribution profile of precursors" refers to spatial distributions of the fluxes, concentrations and/or energies of precursors. In this context, flux refers to the number of precursors crossing a unit area per unit time, and may be expressed in units of: (number of precursors) $cm^{-2} s^{-1}$. Source distribution profiles may be expresses in one, two or three spatial dimensions. Source distribution profiles may be homogeneous wherein the fluxes, concentrations and/or energies of precursors are substantially the same for all points on a receiving surface or may be inhomogeneous wherein the fluxes, concentrations and/or energies of precursors are not substantially the same for all points on a receiving surface.

"Thin film processing" refers to deposition, removal and/or manipulation of materials on a substrate. Thin film processing includes physical thin film deposition of thin films, chemical thin film deposition of thin films, doping thin films with impurities, changing the composition of thin films, changing the physical structure or physical state of thin films, annealing thin films and removal of material from thin films and substrates, for example by etching.

"Precursor" refers to materials generated by a thin film deposition source and comprises particles such as atoms, molecules, ions, electrically charged particles, particles having no electric charge and any clusters, aggregates or combinations of these materials. In some applications, precursor also refers to electrons generated by a thin film deposition source or material removal system, such as an electron beam etching system. Thin films can be processed using the present methods by a variety of physical and chemical processes involving precursors including, but not limited to, condensation of precursors on a substrate surface, nucleation of phase changes of precursors on a substrate surface, chemical reaction of precursors on a substrate, adhesion of a precursor to a substrate "Flux region" refers to a region of a thin film deposition system having precursors present. Thin film layers are deposited onto a substrate in a thin film deposition system by positioning the substrates in a flux region. In the present invention, substrates and deposition sensors are positioned and moved in a flux region during processing of a thin film. In some embodiments, the flux region of a thin film deposition system is located within a vacuum chamber.

"Thin film deposition source" refers to a device or device component for generating precursors for thin film processing. Thin film deposition sources useful in the methods and devices of the present invention include, but are not limited to, physical thin film deposition sources such as ion beam and electron beam sputtering sources, magnetron sputtering sources, chemical evaporation sources, thermal evaporation sources, and chemical thin film deposition sources such as plasma enhanced chemical thin film deposition sources, thermal chemical thin film deposition sources, and ultra high vacuum chemical thin film deposition sources.

"Process source thickness factor" refers to the path integral $$T_{\vec{p}}(t_1, t_2) = \int_{t_1 \vec{p}(t) \vec{n}(t)}^{t_2} R(\vec{p}(t), \vec{n}(t), t) dt, \quad (I)$$

where $\vec{p}(t)$ is the time-dependent trajectory (path) of the substrate or sensor, $\vec{n}(t)$ is the time-dependent normal vector of the substrate or sensor as it follows the trajectory, $R(\vec{p}(t), \vec{n}(t), t)$ is the number of precursors per second that will act on the substrate or sensor (e.g. will stick for a deposition process) at the point $\vec{p}(t)$ and orientation (surface normal) $\vec{n}(t)$, at time t, and $t_1$ and $t_2$ are beginning and end times.

For a time-dependent quantity, f(t), the statistical mean, denoted $<f(t)>_t$, refers to the average of f(t) over a time period that is long compared to the process time.

The time scale for changes in the deposition rate on the part or monitor due to motion of the trajectory is $\Delta t_{motion} = \min(R/|d\vec{r}/dt|, 1/|d\hat{n}/dt|)$, where R is the characteristic width of the deposition beam. Source fluctuations on time scales much smaller than this are not of significance because the deposited thickness is the same as from a steady source with a deposition rate that is the average deposition rate over many of these very rapid fluctuations. Over time scales on the order of or greater than $\Delta t_{motion}$, however, gradual changes in the source rate could lead to significant process errors, for example if one does not monitor the progress of the layer thickness during deposition but instead choose a fixed stop time based on the previously measured deposition rate. We will call this larger time scale the characteristic time of source fluctuations, and it is defined as follows.

Consider a layer deposited for a layer time $\Delta t_L$ on two parts (or a part (i.e. substrate) and a monitor) that follow identical trajectories, but one occurring at a time displaced by $\Delta t$. The fractional difference in thickness of these two parts is:

$$\frac{\Delta T(t \to t + \Delta t)}{T} \equiv$$

$$\left\{ \int_t^{t+\Delta t_L} R(\vec{r}(t + \Delta t), \hat{n}(t + \Delta t)) dt - \int_t^{t+\Delta t_L} R(\vec{r}(t), \hat{n}(t)) dt \right\} \Big/ \int_t^{t+\Delta t_L} R(\vec{r}(t), \hat{n}(t)) dt.$$

The characteristic time of source fluctuations is the smallest time displacement (Δt) for which $$\sqrt{\left\langle \left(\frac{\Delta T(t \to t + \Delta t)}{T}\right)^2 \right\rangle} = A,$$

where A is a tolerance on the layer thickness errors (e.g. 0.5%).

In words, the characteristic time of source fluctuations is the time displacement for which the difference in the layer thickness created at displaced times but identical trajectories typically or statistically (RMS) exceeds the tolerance on layer thickness errors. This time scale is typically about 5 minutes in IBS film coating chambers for a tolerance of 0.5%.

There are other similarly applicable ways to define the characteristic time of source fluctuations, for example in terms of the decay of a correlation function involving the layer thickness for two identical trajectories that are displaced in time.

"Coincident trajectories" refer to the motion of two or more moveable devices or device components, such as substrates and deposition sensors that are coincident with respect to time and space. Coincident trajectories pass through the same points in space at similar times. A trajectory coincident with another trajectory may provide a path identical to the path of the other trajectory, may provide a component of its path that overlaps a portion or all of the path of the other trajectory, or may provide a path that fully encompasses the path of the other trajectory in addition to having an additional nonoverlapping component of its path. Coincident trajectories useful in the present invention may be cyclical or noncyclical. Coincident trajectories useful in the present invention may be entirely contained within a flux region of a thin film deposition system or may intermittently pass through the flux region of a thin film deposition system. The term "substantially coincident trajectories" is intended to encompass some deviations from absolute temporal and spatial coincidence of two or more trajectories. In one aspect, substantially coincident trajectories deviate from absolutely coincidence by less than 2 centimeters, per cyclically trajectory. In another aspect, substantially coincident trajectories of translating and/or rotating substrates in a flux region provide substantially the same average fluxes of precursors for a selected deposition interval. In another aspect, the controlled processing determines a stop time (i.e. end point of thin film processing time interval) by continuous time monitoring of the process source thickness factor function on the trajectory of a sensor that follows a path that is substantially coincident with the substrate being processed. For a given target process accuracy A (for example in a deposition process described here this is the tolerance in fractional accuracy of the layer thickness values, typically A=0.5%), we define two trajectories to be substantially coincident over the layer time $\Delta t_L$ if:

$$\left[\left\langle \left(\frac{T_{\bar{p}_2}(t, t + \Delta t_L) - T_{\bar{p}_1}(t, t + \Delta t_L)}{T_{\bar{p}_1}(t, t + \Delta t_L)}\right)^2 \right\rangle_t\right]^{1/2} < A. \quad \text{(IIIa)}$$

Two trajectories (or two paths) are also defined to be substantially coincident if on a smaller time interval, $\Delta t_c$, if $$\left[\left\langle \left(\frac{T_{\bar{p}_2}(t, t + \Delta t_c) - T_{\bar{p}_1}(t, t + \Delta t_c)}{T_{\bar{p}_1}(t, t + \Delta t_c)}\right)^2 \right\rangle_t\right]^{1/2} < A', \quad \text{(IIIb)}$$

for a different threshold A' (usually larger than A) where it can be shown by theory or by measurements, and by statistical analysis, that this condition (IIIa) is true.

For example, if the process accuracy goal is A=0.3% and $\Delta t_L$=30 minutes, then two trajectories are substantially coincident over a time scale $\Delta t_c$=3 minutes if their path integrals differ in RMS by 2%, and it can be shown that this 2% RMS difference in thickness on the 3 minute interval implies that the RMS difference in thickness for the two trajectories will be less than 0.3% for a full 30 minute layer deposition.

"Thickness profile" refers to a one or two dimensional spatial distributions of the physical or optical thicknesses of a thin film or plurality of thin film layers on a receiving area of a substrate or a sensing surface of a sensor. The present invention provides methods of fabricating thin films having uniform thickness profiles and thin films having selected non-uniform thickness profiles "Substantially the same average fluxes of precursors" refers to fluxes of precursors to two or more surfaces during a selected deposition time that result in formation of thin films having physical thicknesses and/or optical thicknesses that are with 1% of each other, preferably for some applications are with 0.5% of each other and more preferably for some applications are with 0.25% of each other "Thin film layer" refers to a thin film comprising a coating of atoms, molecules or ions or mixtures and/or clusters thereof. Thin film layers in the present invention may comprise a single-layer having a substantially constant composition, a single layer having a composition which varies as a function of physical thickness or a plurality of thin films layers. Thin film layers useable in the present invention may have either a homogeneous composition or a heterogeneous composition and may comprise a single phase or a plurality of phases. Thin film layers of the present invention include but are not limited dielectric materials, semiconductors, conducting materials, organic materials such as polymers and any combinations of these materials. In a preferred embodiment, reference to thin dielectric layers in the present invention includes but is not limited to metal oxide, metalloid oxide and salt thin films. Metal oxides, metalloid oxides and salts useable in the present invention include, but are not limited to, Ag, Au, $Ta_2O_5$, $SiO_2$, $HfO_2$, $TiO_2$, $MgF_2$, $AlO_2$, $CaF_2$, $Nb_2O_5$, glass or mixtures of these materials. Thin metalloid and metal layers of the present invention include but are not limited to Si and Al. Thin film layers of the present invention may have any size, shape, physical thickness or optical thickness suitable for a selected application.

"Optical thickness" refers to the effective path length of light that takes into consideration the refractive index of the material light is propagating through. Analytically, optical thickness and optical path length terms may be expressed in the following summation as the product of physical thickness and the refractive index of a layer or plurality of layers:

$$\text{optical thickness} = \text{optical path length} = \sum_x n_x \times L_x, \quad \text{IV}$$

where $L_x$ is the physical thickness of region x and n is the refractive index of region x. Equation IV is applicable to structures comprising single layers, partial layers and multilayer structures.

"Operably connected" and "operably coupled" are used synonymously in the present description and refer to a configuration of two or more device elements such that they can be used in combination to achieve specific functions, operations, functional tasks or device capabilities/features in a particular device configuration. Operably connected device elements can be optically coupled, electronically coupled, electrically coupled, mechanically coupled and magnetically coupled or any combination of these. Operably connected device elements can be in one way communication, in two way communication or any combination of these device configurations. Operably coupled device elements is used in the present invention to provide devices and device configurations having a desired functionality, such as fabrication of spatially uniform thin films and devices comprising thin films having accurately selected physical and/or optical thicknesses, thickness profiles, chemical properties and optical characteristics.

"Spatially uniform films", "thin films having spatial uniformity" and "thin films having a uniform thickness profile" are used synonymously in the present description and refer to thin films having a physical thickness that is substantially constant over a selected thin film area. In one embodiment, spatially uniform films exhibit deviations from an average physical thickness per unit area equal to or less than 0.25% over an area defined by a 10 inch diameter.

"Translation" refers to movement of a device or device component, such as a substrate or deposition sensor. Translation may comprise any type of motion including, but not limited to, rotational motion about a single rotational axis, rotational motion about a plurality of rotational axes, circular orbital motion, elliptical orbital motion, parabolic motion, linear motion and any combination of these.

"Part" and "substrate" are used synonymously in the present description and refer to elements, materials, surfaces, device components and devices undergoing thin film processing.

In the following description, numerous specific details of the devices, device components and methods of the present invention are set forth in order to provide a thorough explanation of the precise nature of the invention. It will be apparent, however, to those of skill in the art that the invention can be practiced without these specific details.

This invention provides methods and devices for fabricating thin film layers and multilayer structures comprising a plurality of thin film layers exhibiting good spatial uniformity. Particularly, the present invention provides film thickness monitoring and control methods and systems which allow the physical thickness, thickness profile, chemical composition and optical properties of deposited thin films to be selected within improved accuracy and precision relative to convention monitoring and control methods and systems employing a fixed position sensor.

FIG. 1A is a schematic drawing of a thin film layer monitoring and control system of the present invention employing a dual rotation planetary system. As shown in FIG. 1A, the thin film monitoring system 100 comprises a dual rotation planetary system 105 having a central rotating platform 110 and a plurality of rotating sub-planets 115A, 115B, 115C and 115D. Central rotating platform 110 is configured to rotate about central rotational axis 120 (as shown by arrow proximate to central rotational axis 120) and rotating sub-planets 115A, 115B, 115C and 115D are configured to rotate about first, second, third and fourth rotational axes 117A, 117B, 117C and 117D, respectively (as shown by arrow proximate to rotational axes 117A, 117B, 117C and 117D). Substrate 130 undergoing thin film processing is affixed to rotating sub-planet 115A and sensor 135 is affixed to rotating sub-planet 115C. Substrate 130 has a receiving surface 140 for receiving particles in a flux region of a thin film deposition system and sensor 135 has a sensing surface 145 and a wireless transmitter 150. Wireless transmitter 150 is capable of generating output signals corresponding to measurements made by sensor 135 and transmitting these output signals to a fixed position receiver 155. In FIG. 1A, the transmission of output signals is schematically illustrated by arrow 160. Optionally, receiver 155 may be operably connected to thin film deposition system controller 166 capable of receiving output signals, calculating thin film properties, and controlling operating conditions and device components of a thin film deposition system, such as a thin film deposition source, the net pressure, partial pressure of $O_2$ or other bath gas, and/or the temperature in a thin film deposition system and the rotational velocities of the central planet and sub-planets. In this embodiment, thin film deposition system controller 166 is operably connected to a thin film deposition system or component thereof, such as a thin film deposition source, a thin film deposition chamber and/or dual rotation planetary system 105.

As shown in FIG. 1A, first, second, third and fourth rotational axes 117A, 117B, 117C and 117D are positioned at about the same distance from central rotational axis 120. Rotation of central rotating platform 110, in this configuration, results in movement of each of rotating sub-planets 115A, 115B, 115C and 115D in a circular orbit about central rotational axis 120. Optionally, substrate 130 is positioned a distance from first rotational axis 117A substantially equal to the distance that sensing surface 145 is positioned from third rotational axis 117C. In a useful embodiment of the present invention providing enhanced thickness control of thin film layers deposited on receiving surface 140, first, second, third and fourth rotational axes 117A, 117B, 117C and 117D are positioned about 15 centimeters from central rotational axis 120, receiving surface 140 is position about 4 centimeters from first rotational axes 117A, and sensing surface is position about 4 centimeters from third rotational axes 117C.

To provide thin film layer control, thin film monitoring and control system 100 is positioned, at least partially, within the flux region of a thin film deposition system having precursors therein. During exposure to precursors in the flux region, central rotating platform 110 is rotated about central rotational axis 120 and rotating sub-planets 115A, 115B, 115C and 115D are rotated about first, second, third and fourth rotational axes 117A, 117B, 117C and 117D, respectively. In an embodiment of the present invention providing thin films having good spatial uniformity, rotating sub-planets 115A, 115B, 115C and 115D rotate about their respective rotational axes at the same rotational velocity. In an exemplary embodiment, the central rotating platform 110 rotates about central rotational axis 120 at a rotational velocity of about 60 rotations per minute to about 100 rotations per minute, and rotating sub-planets 115A, 115B, 115C and 115D rotate about their respective rotational axes at rotational velocities of about 120 rotations per minute.

Figure 2:
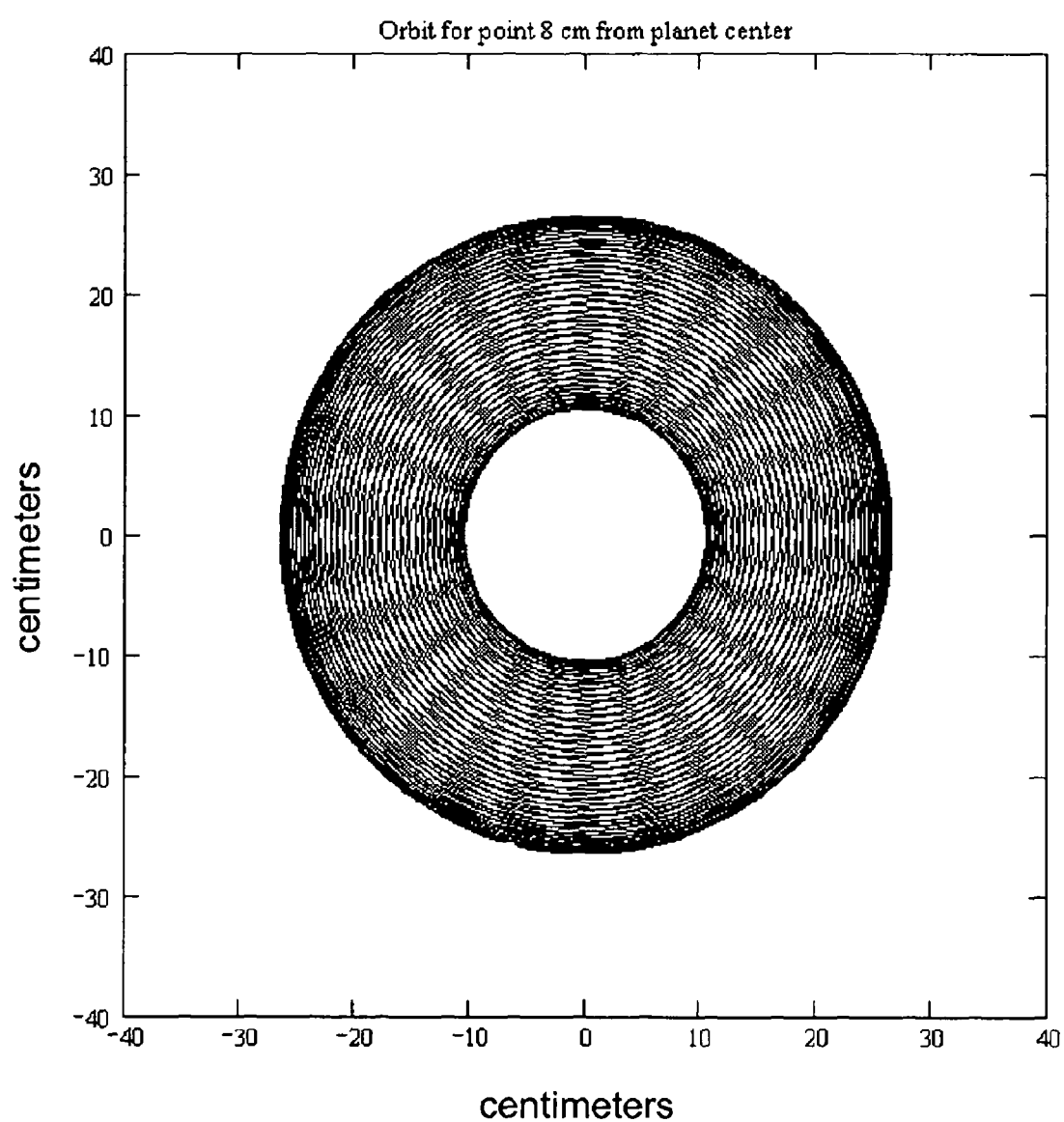
FIG. 2 shows an exemplary epitrochoid trajectory of a point on a substrate or sensor generated by a dual rotation planetary system. The x and y axis in FIG. 2 are in units of centimeters.

Rotation of central rotating platform 110 and rotating sub-planets 115A, 115B, 115C and 115D is preferably carried out simultaneously for a selected deposition period thereby generating epitrochoid trajectories of receiving surface 140 of substrate 130 and sensing surface 145 of sensor 135. FIG. 2 shows an exemplary epitrochoid trajectory generated by a dual rotation planetary system. Receiving surface 140 and sensing surface 145 are moved through a plurality of completed cyclical epitrochoid trajectories during deposition of a thin film layer. Simultaneous rotation of central rotating platform 110 and sub-planets 115A, 115B, 115C and 115D moves receiving surface 140 and sensing surface 145 through substantially coincident cyclical trajectories in the flux region, thereby exposing these components to substantially similar net deposition conditions over the selected deposition period. In one embodiment, for example, simultaneous rotation of central rotating platform 110 and sub-planets 115A, 115B, 115C and 115D exposes the sensing surface 145 and receiving surface 140 to similar concentrations of precursors in a given source distribution of precursors for similar time periods. The use of substantially coincident receiving surface and sensing surface trajectories is particularly useful in embodiments wherein the rate of completing a cyclical trajectory is on the same time scale or faster than the characteristic time of source fluctuations. Further, use of substantially coincident receiving surface and sensing surface trajectories is particularly useful in embodiments wherein the rate of completing a cyclical trajectory is fast enough such that receiving surface and sensing surfaces accumulate thin films having substantially the same thicknesses (e.g. within 0.3%).

Deposition, condensation and/or reaction of precursors on sensing surface 145 and receiving surface 140 results in formation and growth of thin film layers on these components as they are moved along coincident trajectories in the flux deposition region. Preferably, the trajectories of these components are such that thin film layers having substantially the same physical properties such as physical thickness, chemical characteristics such as chemical composition, and optical properties such as refractive index and optical thickness are generated on sensing surface 145 and receiving surface 140 in a time scale that is shorter than the characteristic time of fluctuations in the source distribution profile (i.e. the characteristic time of source fluctuations). Sensor 135 is configured to make periodic or aperiodic, real time measurements of select physical and/or chemical characteristics of the thin film layer on sensing surface 145 and wireless transmitter 150 generates output signals corresponding to these measurements and transmits them to receiver 155, which may be configured to direct the output signals to the thin film deposition system controller 166. Output signals are analyzed in real time by a thin film deposition system controller 166, thereby providing real time determinations of important physical properties, chemical characteristics, and optical properties which directly correspond to the thin film layer on receiving surface 140. These determinations serve the basis of control signals generated by thin film deposition system controller 166 which may be used to control device components such as the thin film deposition source, operating conditions of the thin film deposition system such as the temperature and/or pressure (net pressure or partial pressures of $O_2$ and/or other bath gases) of the thin film deposition chamber or any combination of these. For example, control signals generated by thin film deposition system controller 166 may serve as the basis of control commands stopping generation of precursors by the thin film deposition source, changing the composition of precursors to initiate deposition of a new thin film layer or providing the basis of closed loop feedback control of thin film deposition conditions.

Figure 1B:
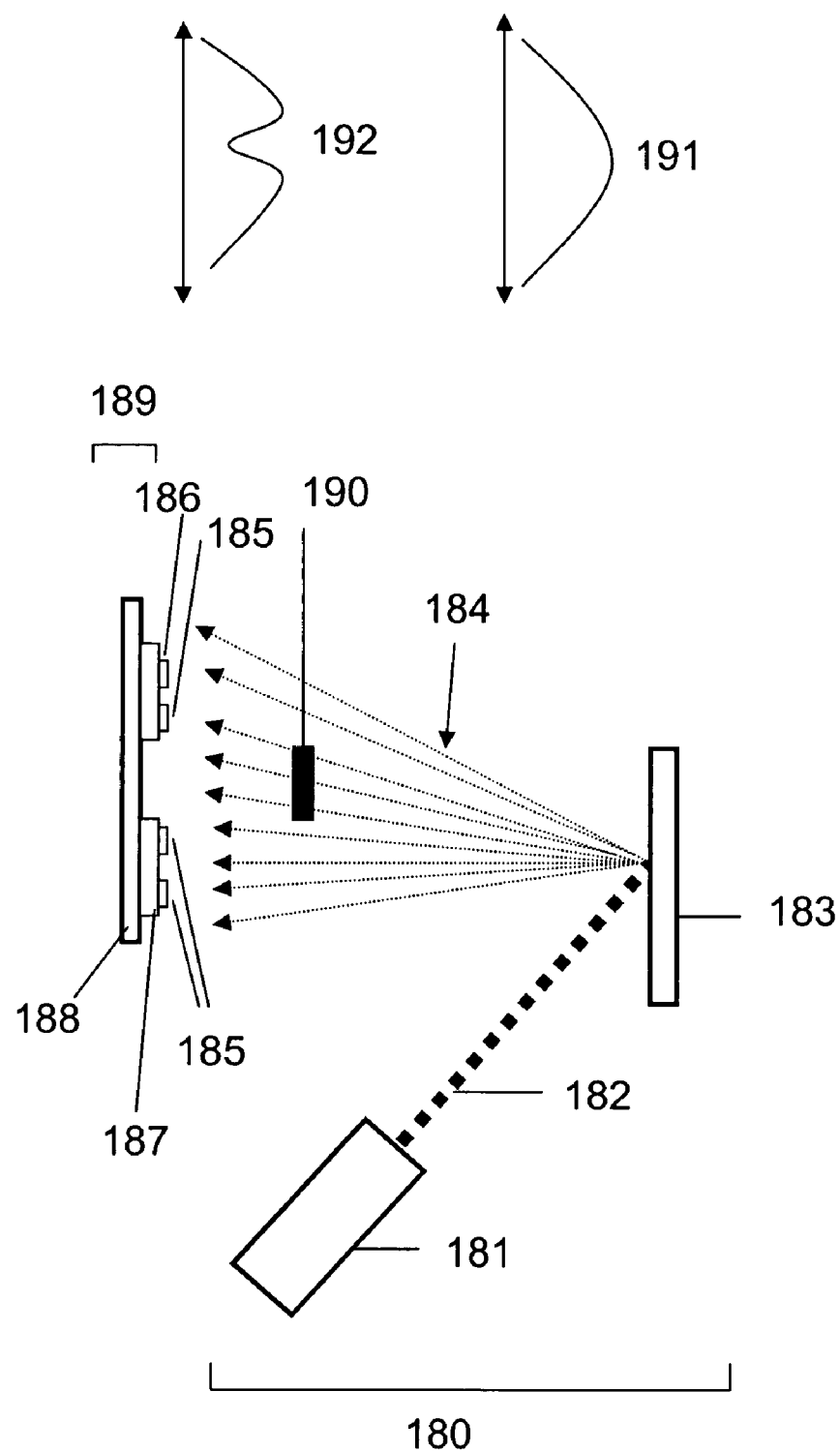
FIG. 1B shows a schematic diagram illustrating a top plan view of a thin film layer monitoring and control system of the present invention having a shadow mask.
Figure 3:
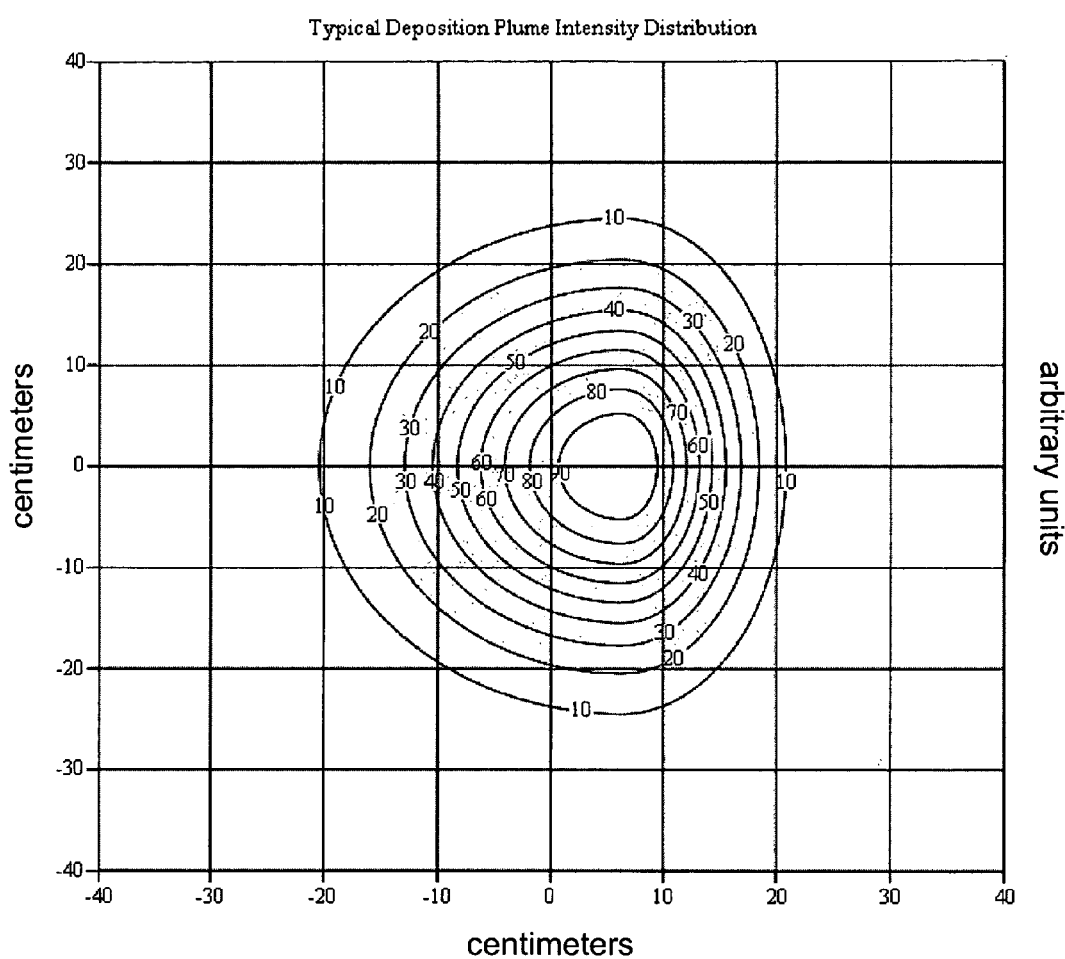
FIG. 3 shows an exemplary spatial distribution profile of precursors generated by an ion sputtering thin film deposition source. Contour lines of equal flux (in arbitrary units) are shown. X and Y axes are in units of centimeters.

Optionally, the thin film layer monitoring an control system of this aspect of the present invention may further include one or more source distribution-modifying elements, such as shadow masks, positioned between the thin film deposition source and the rotating and/or translating substrates undergoing processing (and also rotating and/or translating sensor). FIG. 1B shows a schematic diagram illustrating a top plan view of a thin film layer monitoring and control system of the present invention having a shadow mask. As shown in FIG. 1B, thin film deposition source 180 is an ion beam sputtering source comprising a source of ions 181 which generates and ion beam 182 that is directed onto a target 183 having a selected composition. Precursors (schematically illustrated as arrows 184) are generated from the interaction of ion beam 182 and target 183. Precursors 184 are characterized by a first spatial distribution profile 191 (schematically represented in one spatial dimension) in a region proximate to target 183. FIG. 3 shows an exemplary spatial distribution profile of precursors generated by an ion beam sputtering thin film deposition source. Contour lines of equal flux are indicated (in arbitrary units) and horizontal and vertical axes are in units of centimeters.

Figure 4A:
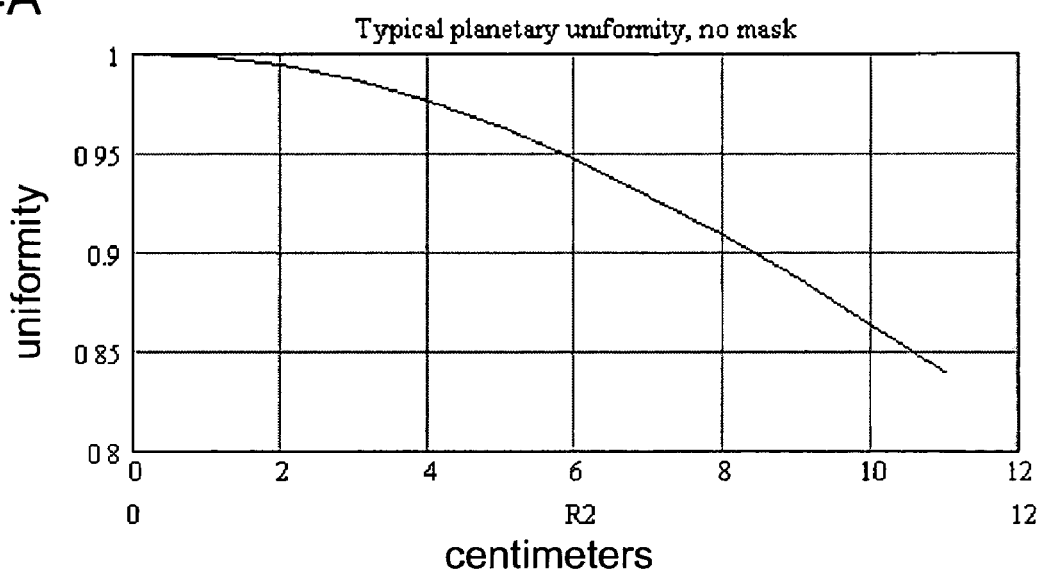
FIG. 4A shows a plot of thin film thickness uniformity as a function of radial position for deposition conditions without a shadow mask present and FIG. 4B shows a plot of thin film thickness uniformity as a function of radial position for deposition conditions with a shadow mask present.
Figure 4B:
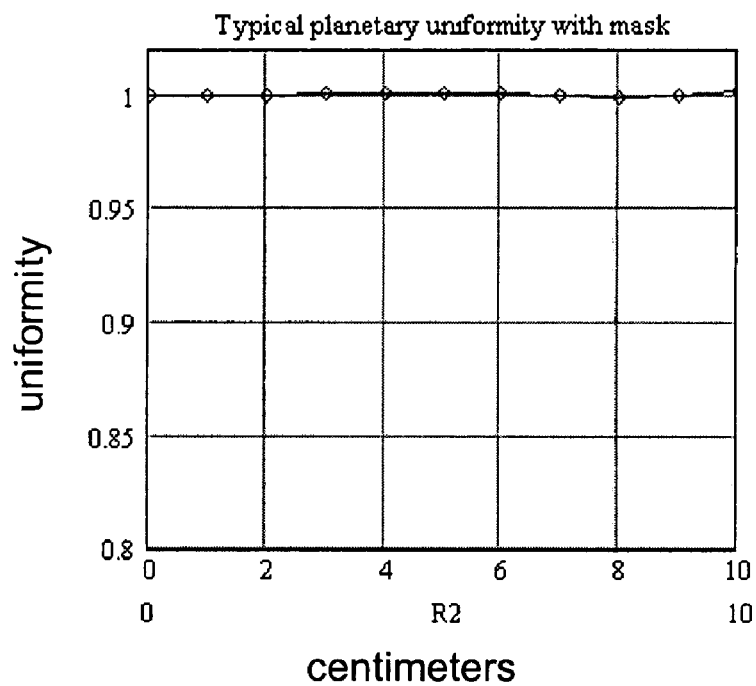

Precursors 184 are directed to substrates 185 and sensor 186 on sub-planets 187 on central rotating platform 188 of dual rotation planetary system 189, thereby forming thin film layers on the receiving surfaces and sensing surface of these components. Shadow mask 190 is positioned between thin film deposition source 180 and substrates 185 and sensor 186, and at least partially prevents transmission of some precursors from thin film deposition source 180 to substrates 185 and sensor 186. As a result of the presence of shadow mask 190 precursors characterized by a second spatial distribution profile 192 are exposed to receiving surface of substrates 185 and sensing surface of sensor 186. As shown in FIG. 1B, second spatial distribution profile of precursors 192 (schematically represented in one spatial distribution) is different from first spatial distribution profile 191 and is characterized by a dip in the intensity of precursors corresponding to the position of shadow mask 190. Use of a shadow mask in combination with substrates 185 and sensor 186 provided on dual rotation planetary system 189 provides a means of fabricating spatially uniform thin films layers on substrates 185 having an accurately selected thickness. Particularly, use of a shadow mask 190 in this embodiment of the present invention establishes substantially the same average fluxes of precursors to receiving surfaces of substrates 185 and sensor surfaces of sensor 186 having different radial positions with respect to the rotational axes of subplanets 187. Therefore, shadow mask 190 may be viewed as a device component useful for establishing and maintaining coincident trajectories of substrates and sensors having different radial positions with respect to the rotational axes of subplanets 187. FIG. 4A shows a plot of thin film thickness uniformity as a function of radial position for deposition conditions without a shadow mask present and FIG. 4B shows a plot of thin film thickness uniformity as a function of radial position (in centimeters) for deposition conditions with a shadow mask present. In FIGS. 4A and 4B, uniformity is defined relative to the thickness at the center of a rotating subplanet of a dual rotation planetary system, and is expressed by the equation:

$$\text{uniformity} = \left( \frac{T_x}{T_{center}} \right); \quad (V)$$

wherein $T_x$ is the thickness at point x and $T_{center}$ is the thickness at the center of the rotating subplanet. A comparison of FIGS. 4A and 4B indicates that incorporation of a shadow mask can be useful for fabricating uniform thickness thin film structures on substrates having different radial positions. This combination of device components, therefore, makes the present invention is applicable to high-throughput fabrication of single and multilayer thin film structures, wherein a plurality of substrates having different radial positions are processed simultaneously.

Figure 5:
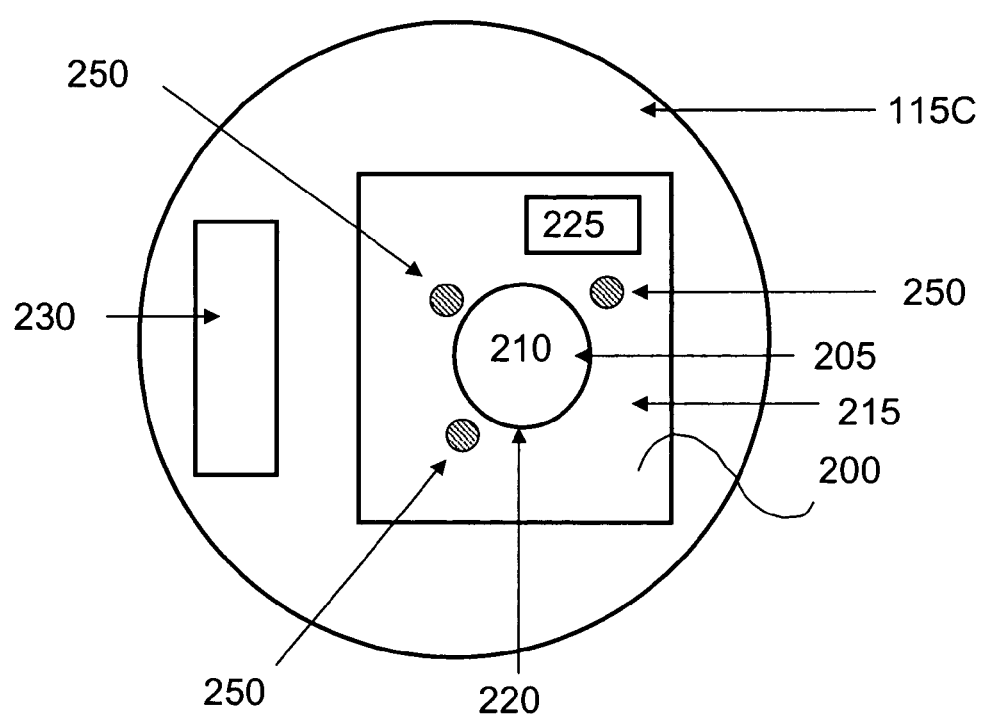
FIG. 5 provides a schematic drawing illustrating an embodiment of the present invention providing accurate layer thickness control having a sensor that is a quartz crystal microbalance sensor positioned on one subplanet of a dual rotation planetary system.

FIG. 5 provides a schematic drawing illustrating an embodiment of the present invention providing accurate layer thickness control, wherein sensor 135 is a crystal sensor, such as a quartz crystal microbalance sensor that provides measurements in real time of the mass of a thin film layer deposited on sensing surface 145. In this embodiment, sensor 200 positioned on sub-planet 115C and comprises crystal 205 having a sensing surface 210, shield plate 215 having an aperture 220 which exposes sensing surface 210 to a flux of precursors, wireless transmitter 225 and battery power supply 230. Measurement circuitry for crystal 205 (not shown in FIG. 5) is provided behind shield plate 215 so as to avoid electrical and magnetic interference resulting from electric fields, magnetic fields or both generated in the flux region. In some embodiments, measurement circuitry is preferably compatible with low pressure environments, such as the low pressure environment of a vacuum system. In one embodiment, wireless transmitter 225 is either an IR transmitter or an RF transmitter. Use of the wireless transmitter 225 and battery power supply 230 is useful in this embodiment of the present invention because it eliminates the need of establishing electrical contact between the sensor 200 and any other device component of the monitoring system. Another advantage provided by the compact, self powered sensor design shown in FIG. 5 is that the sensor can be powered for very long time periods, for example hundreds of hours, that are compatible with high throughput thin film processing applications.

Figure 6A:
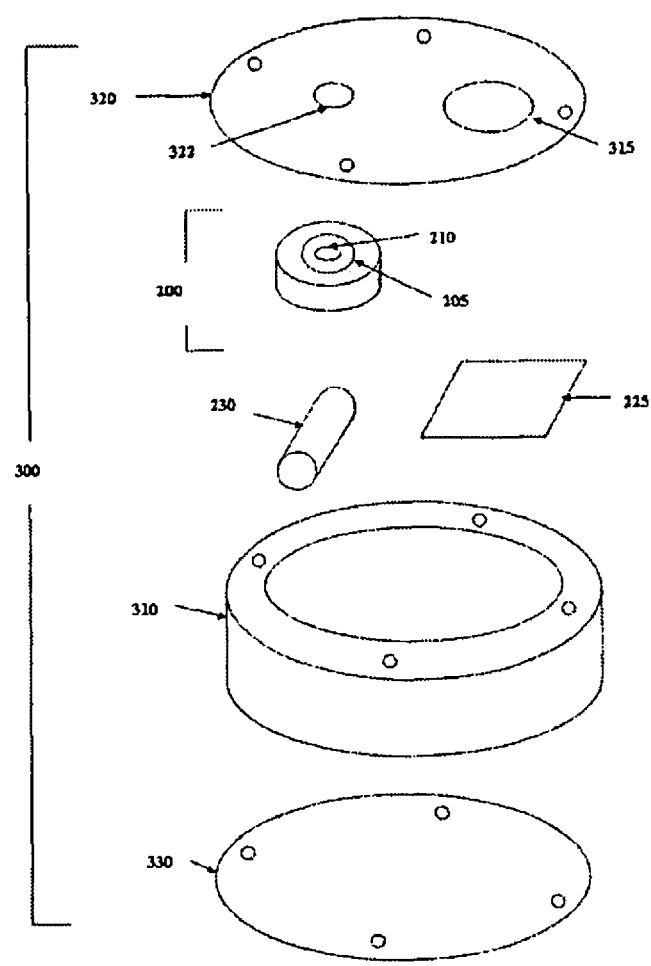
FIG. 6A provides a schematic diagram of an exploded view of a housing element for a deposition sensor of the present invention.
Figure 6B:
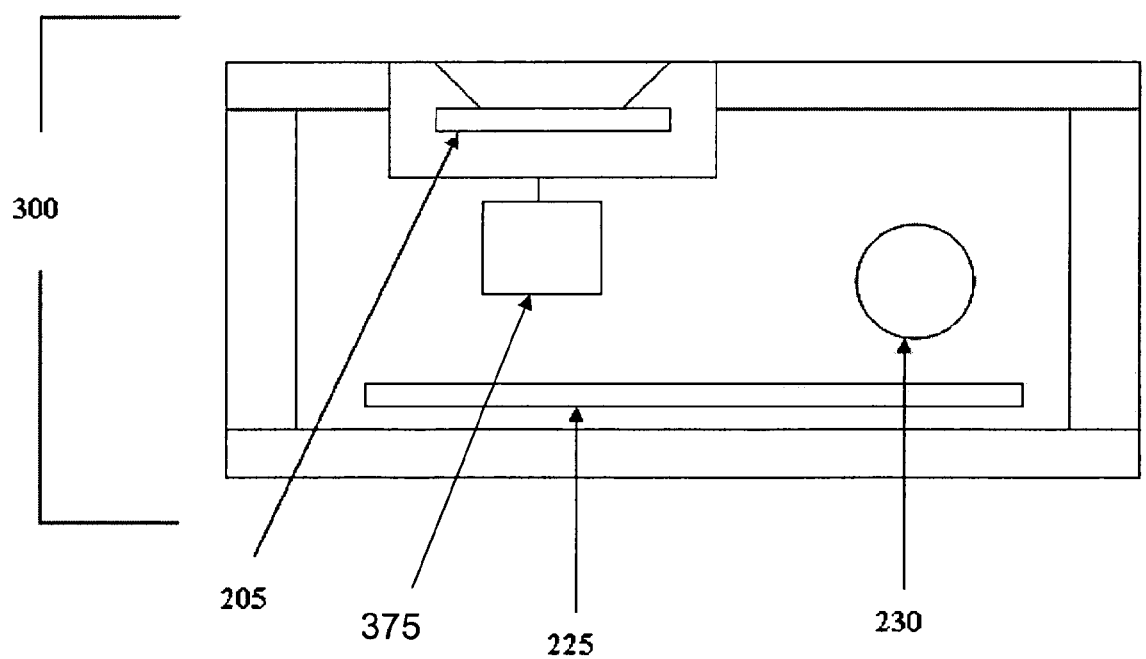
FIG. 6B provides a schematic diagram of a cross sectional side view of sensor a deposition sensor of the present invention.

FIG. 6A provides a schematic drawing showing an exploded view of a housing element 300 for sensor 200. As shown in FIG. 6A, housing element 300 comprises tube element 310, an upper circular element 320 and a lower circular element 330. Upper circular element 310 has a crystal hole 322 for exposing sensing surface 210 of crystal 205 and a witness hole 315 positioned in front of a test substrate which may be evaluated after deposition to verify that a selected thin film thickness is actually achieved during deposition. Tube element 310 is large enough to house crystal 205, transmitter 225 and battery power supply 230. Lower circular element 330 has four through holes for fastening screws that pass through receiving holes in Tube element 310 and terminate in upper circular element 320. The fastening screw configuration provided secures tube element 310 between upper and lower circular elements 320 and 330. The housing design shown in FIG. 6A is capable of securing crystal 205 and associated measuring circuitry such that these elements do not move significantly during rotation of sub-planet 115C. Lower circular element 330 is arranged so that is may be attached to a rotating means (not shown) and, thereby form a sub-planet in a dual planetary rotation system. FIG. 6B provides a schematic drawing of a cross sectional side view of sensor 300 indicating the position of crystal 205, battery 230, crystal measurement circuitry 375, and transmitter 225.

Measurements of the mass of material deposited on sensing surface 210 is achieved in this embodiment of the present invention by monitoring changes in the fundamental resonance frequency of the crystal 205 upon application of an appropriate alternating electric field. In this embodiment, receiver 225 is configured to transmit output signals corresponding to the measured resonance frequency of the crystal 205, and thin film deposition system controller 166 is capable of calculating the mass of materials deposited on the sensing surface 210. With knowledge of the surface area of sensing surface 210 and the expected density of the deposited thin film layer, an observed physical thickness of the thin film layer can be calculated using the measured mass of deposited material. The calculated observed physical thickness is used in layer thickness control methods of the present invention to determine when a thin film layer having a desired physical thickness has been achieved and, thus, identifying the point in time when deposition of precursors is to be stopped. For example, thin film deposition system controller 166 may be configured to compare calculated physical thicknesses to a preselected set point thickness and/or mass, and to generate command signals for stopping the production of precursors by a thin film deposition source upon calculation of a physical thickness that is equal to or exceeds the preselected set point thickness and/or mass.

Figure 7:
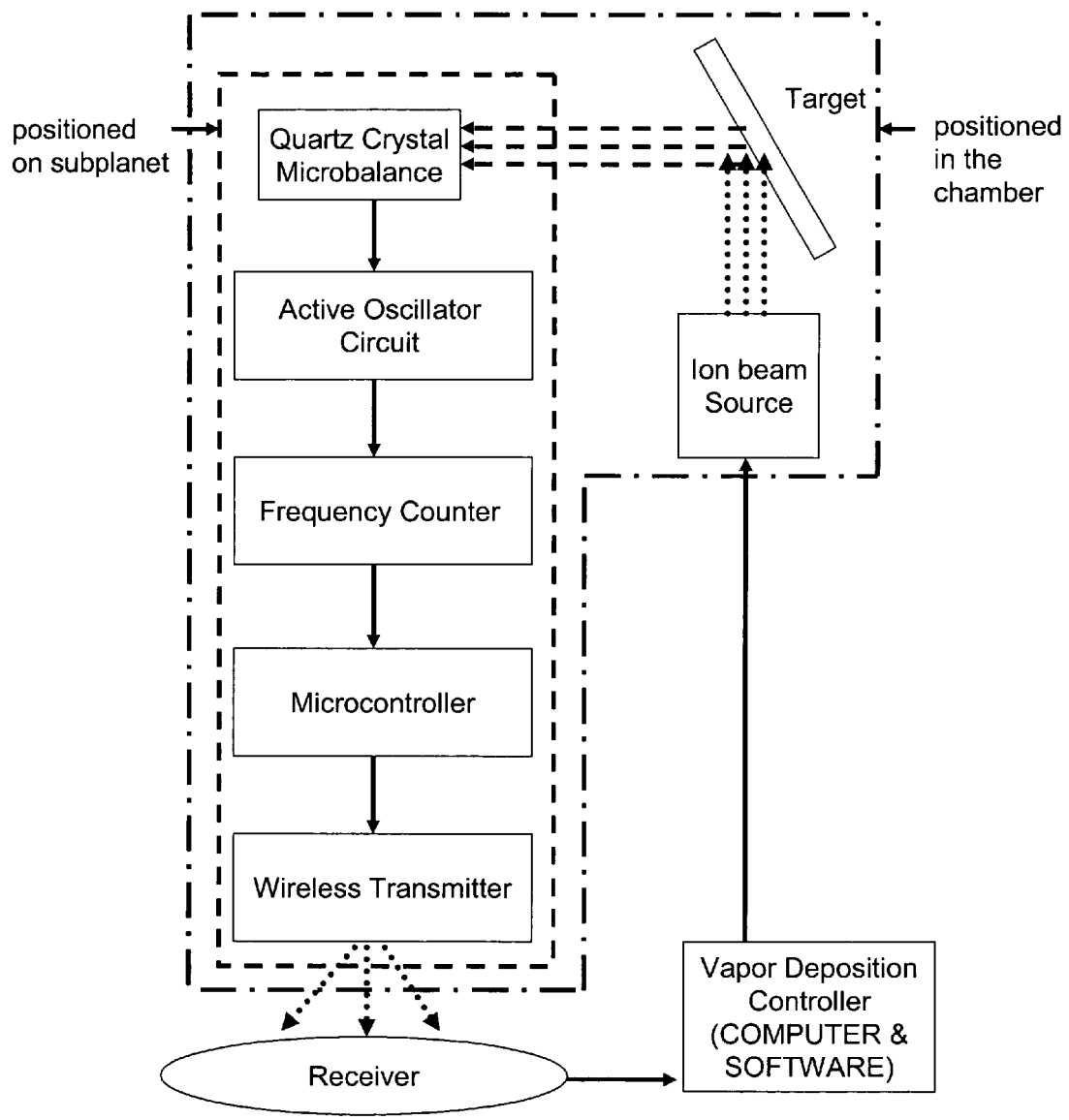
FIG. 7 shows a schematic diagram illustrating operation of an exemplary layer thickness control method for controlling thin film processing using an ion beam sputtering source and a quartz crystal microbalance sensor.

FIG. 7, shows a schematic diagram illustrating operation of an exemplary layer thickness control method for controlling thin film processing using an ion beam sputtering source and a quartz crystal microbalance sensor. As shown in FIG. 7, the ion source generates a beam of ions having a distribution of ion intensities, which is directed onto the surface of a target having a selected chemical composition. Precursors are generated upon interaction with the ion beam and the target, thereby establishing a source distribution of precursors proximate to the sensing surface of a quartz crystal microbalance sensor. A signal is generated by the quartz crystal microbalance sensor that is dependent on the mass of material present on the sensing surface. In one embodiment, the quartz crystal is provided as a part of a closed feedback loop in an active oscillator circuit. A frequency counter is operably connected to the oscillator circuit such that it is capable of counting the number of oscillations per unit time over a selected time and which converts the output signal from the oscillator circuit to a square wave having a frequency representative of the frequency of the quartz crystal microbalance output signal. This signal is provided to a microcontroller which encodes the data by conversion into a digital signal. The digital signal is provided as input to a wireless transmitter which generates a wireless signal that is transmitted to a receiver operably connected to a thin film deposition system controller, such as a computer or processor which is capable of running process control software. The thin film deposition system controller converts the transmitted signal into a mass measurement and determines an observed physical thickness from the mass measurement. The thin film deposition system controller is also capable of generating command signals based on the observed physical thickness, which may be used to control device components of the thin film deposition system. In the method schematically illustrated in FIG. 7, thin film deposition system controller is operably connected to the ion beam source and capable of controlling the rate and/or source distribution of ions generated and directed at the target.

As also shown in FIG. 7, the quartz crystal microbalance, active oscillator circuit, frequency controller, microcontroller and wireless transmitter are all provided on a rotating sub-planet of a dual planetary system. In some applications, providing the crystal measurement circuitry on the rotating sub-planet is particularly useful for providing accurate mass and/or physical thickness measurements because sliding, moving or rotating electrical contacts to the crystal are avoided. Avoiding use of sliding, moving and/or rotating electrical contacts to the crystal can eliminate or minimize significant errors in measurements of the resonance frequency of a quartz crystal microbalance due to changes in resistance, capacitance, impedance and conductance which are often are introduced by such motions. As also shown in FIG. 7, the quartz crystal microbalance, active oscillator circuit, frequency controller, microcontroller, wireless transmitter, ion beam source and target are all provided in a vapor deposition chamber and the receiver and vapor deposition controller are provided outside the vapor deposition chamber.

The present invention also includes methods and algorithms for controlling the thickness of thin films deposited on substrates undergoing processing. In an exemplary method, a plurality of real time measurements of the frequency ($f_t$) of a quartz crystal microbalance are provided by the monitoring and control systems of the present invention a specified time interval ($\Delta t$). These measurements are converted to a normalized change in frequency ($\Delta f_{normalized}$) via the expression:

$$\Delta f_{normalized} = \left(\frac{f_0 - f_t}{f_0}\right). \quad (II)$$

The calculated normalized change in frequency ($\Delta f_{normalized}$) is converted into physical thickness using an empirically determined lookup table, function or algorithm. Physical thickness is determined at several time intervals during deposition and used in a predictive algorithm to determine the deposition time required to achieve a desired thickness. Exemplary predictive algorithms periodically fit a plurality of experimentally determined physical thickness calculations to ascertain an average deposition rate over a selected time interval useful for predicting stopping times required for a desired thickness.

Exemplary thin film deposition controllers of the present invention comprise computers, computer processors and other hardware equivalents. Exemplary computers useable in the present methods include microcomputers, such as a IBM personal computer or suitable equivalents thereof, and work station computers. In one embodiment of the present invention, a thin film deposition controller of the present invention comprises a computer capable of running process control software and/or algorithms for calculating physical, chemical and/or optical properties of thin films. As appreciated by one skilled in the art, computer software code embodying the methods and algorithms of the present invention may be written in any suitable programming language. Exemplary languages include, but are not limited to, C, C++ or any other versions of C, Perl, Java, Pascal, or any equivalents of these.

In some sensor configurations, the crystal resonance frequency and the measurement circuitry for operating the crystal sensor is dependent on temperature. Accordingly, determination of the mass of a thin film deposited on sensing surface 210 is a temperature dependent measurement. Referring again to FIG. 5, to account for this temperature dependence, sensor 200 may further comprise one or more temperature sensors 250, for example thermocouples or thermopiles, for providing real time, direct measurements of the temperature of material deposited on sensor 200. In an alternative embodiment, the temperature of the crystal is indirectly determined by monitoring the frequencies of the fundamental and third harmonic modes of the crystal. In these embodiments, receiver 225 is configured to transmit output signals corresponding to both mass and temperature measurements, and thin film deposition source controller 160 is capable of determining the mass of deposited material corrected for any temperature dependence in the crystal resonance frequency and measurement circuitry. Using the measured temperature information, for example, the resonance frequency can be corrected based on experimental calibration data that is measured and analyzed prior to thin film deposition.

Figure 8A:
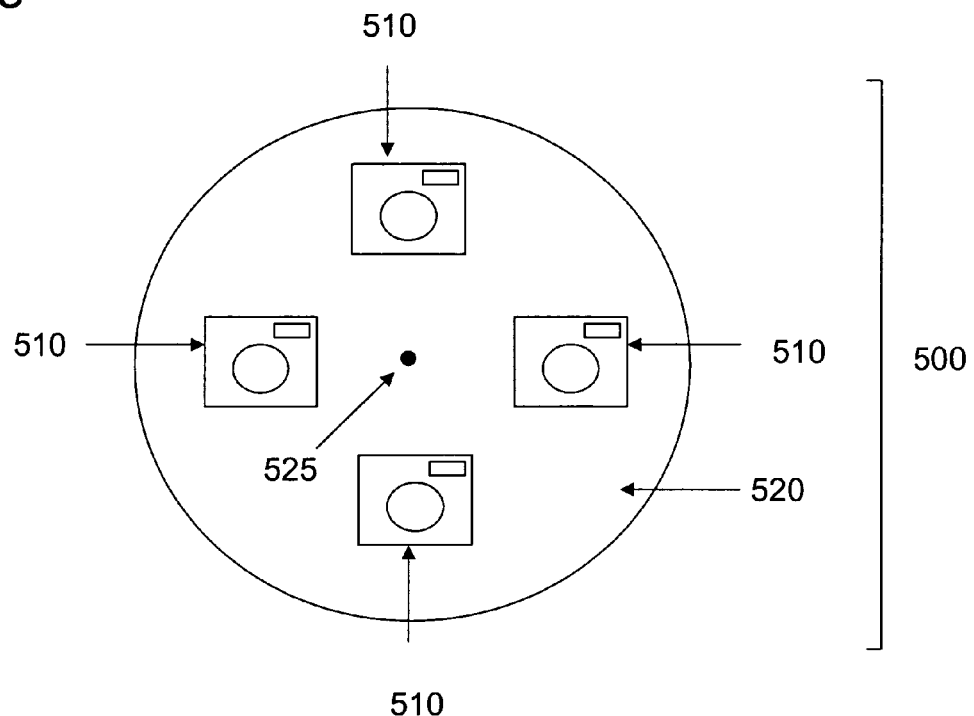
FIG. 8A provides a schematic diagram illustrating a sensor device configuration wherein a plurality of sensors are positioned on a sub-planet that rotates about sub-planet rotational axis.
Figure 8B:
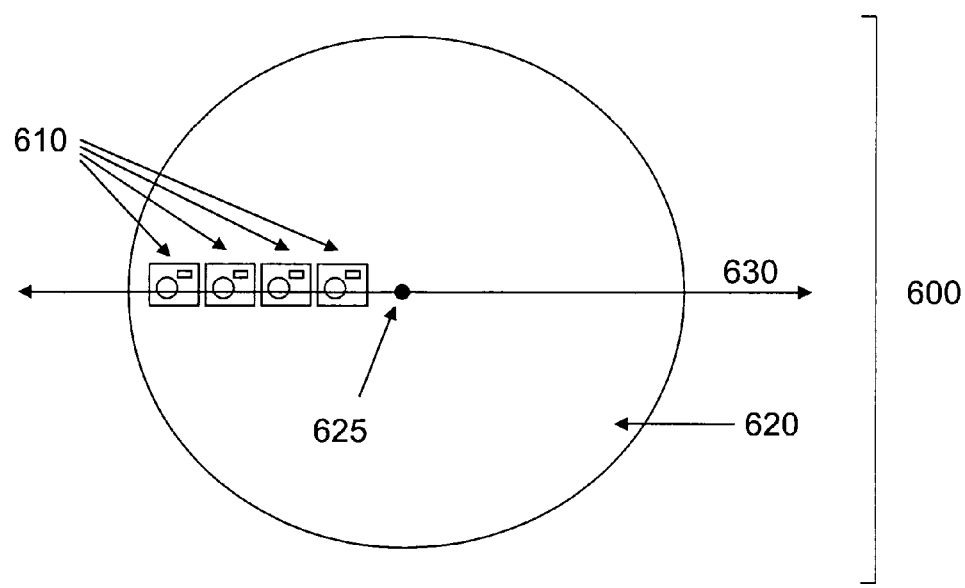
FIG. 8B provides a schematic diagram illustrating an alternative sensor device configuration wherein a plurality of sensors are positioned such that their sensing surfaces are positioned at different distances from sub-planet rotational axis along sensor axis.

The present invention includes a number of other sensor configurations useful for thin film device fabrication applications. FIG. 8A provides a schematic diagram illustrating a sensor device configuration 500 wherein a plurality of sensors 510 are positioned on a sub-planet 520 that rotates about sub-planet rotational axis 525. As shown in FIG. 8A, the sensing surfaces 530 of the sensors 510 are positioned the same distance from sub-planet rotational axis 525. Sensors 510 may comprise the same type of sensor capable of measuring the same thin film property or sensors 510 may comprise different types of sensors capable of measuring different thin film properties. An advantage of this configuration is that it includes embodiments wherein a suite of complementary thin film measurements are made and analyzed in real time, thereby allowing for enhanced thin film processing control. FIG. 8B provides a schematic diagram illustrating an alternative sensor device configuration 600 wherein a plurality of sensors 610 are positioned such that their sensing surfaces 630 are positioned at different distances from sub-planet rotational axis 625 along sensor axis 630. In this embodiment, sensors 610 may comprise the same type of sensor capable of measuring the same thin film property or sensors 610 may comprise different types of sensor capable of measuring different thin film properties. An advantage of this configuration is that it includes embodiments wherein sensors 610 undergo a plurality of different trajectories that are coincident with trajectories of a plurality of substrates having receiving surfaces positioned at different distances from the rotational axis of a sub-planet in a dual rotation planetary system.

Referring again to FIG. 1A, the present invention includes embodiments wherein additional substrates 170 are provided on any of sub-planets 115A, 115B, 115C and 115D. Additional substrates 170 may be provided on the same or different sub-planets. Sensor 135 can be provided on its own sub-planet, as shown in FIG. 1A, or can be provided on a sub-planet having one or more substrates thereon. Although the embodiment shown in FIG. 1A indicates 4 sub-planets, the methods and devices of present invention may be practiced using dual planetary systems having any number of sub-planets. Further, the methods and devices of the present invention may be practiced using higher order planetary systems, such as triple and quadruple planetary systems. Further, the present invention includes embodiments employing a plurality of deposition sensors positioned on the same or different sub-planets of a planetary system. This aspect of the present invention is particularly useful for providing measurements of a distribution of precursors for a given thin film deposition source that may be used to design shadow masks for a given application (e.g. determine the physical dimensions of a shadow mask) or to control a dynamic shadow mask.

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. Methods and devices useful for the present methods can include a large number of optional device elements and components including, pressure monitoring devices, temperature monitoring devices, substrate translators and rotators, vacuum systems and vacuum chambers, valves, pumps, lasers, temperature controllers, photodetectors, heating elements and shutters.

The following references relate generally to thin film technology, semiconductor processing, optical monitoring, and crystal monitoring: (1) "Optical Monitoring of Thin-Film Thickness," R. Richier, A. Fornier, and E. Pelletier, Ch. 3, pages 57-90, *Thin Films for Optical Systems (Optical Engineering)*, Edited by Francois R. Flory and M. Mekker, ISBN 0824796330, Marcel Dekker Jul. 1, 1995; (2) "Deposition Technologies and Applications: Introduction and Overview," Werner Kern and Klaus Schuegraf, pages 1-25, *HandBook of Thin-film Deposition Processes and Techniques, Principles, Methods, Equipment, and Applications*, Edited by Klaus K. Schuegraf, Noyes Publications, ISBN 0-8155-1153-1, 1988. (3) "Introduction to Sputtering," Brian Chapman and Stefano Mangano, pages 291-318, *HandBook of Thin-film Deposition Processes and Techniques, Principles, Methods, Equipment, and Applications*, Edited by Klaus K. Schuegraf, Noyes Publications, ISBN 0-8155-1153-1, 1988; and (4) C. U. Lu and O. Lewis, *J. Appl. Phys.* 43, p 4385 (1972).

STATEMENTS REGARDING INCORPORATION BY REFERENCE AND VARIATIONS

All references cited throughout this application, for example patent documents including issued or granted patents or equivalents; patent application publications; and non-patent literature documents or other source material are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

Every formulation or combination of components described or exemplified herein can be used to practice the invention, unless otherwise stated.

Whenever a range is given in the specification, for example, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, materials, reagents, synthetic methods, purification methods, analytical methods, assay methods, and methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

EXAMPLE 1

Film Thickness Monitoring and Control Methods Using an Optical Sensor

Figure 9A:
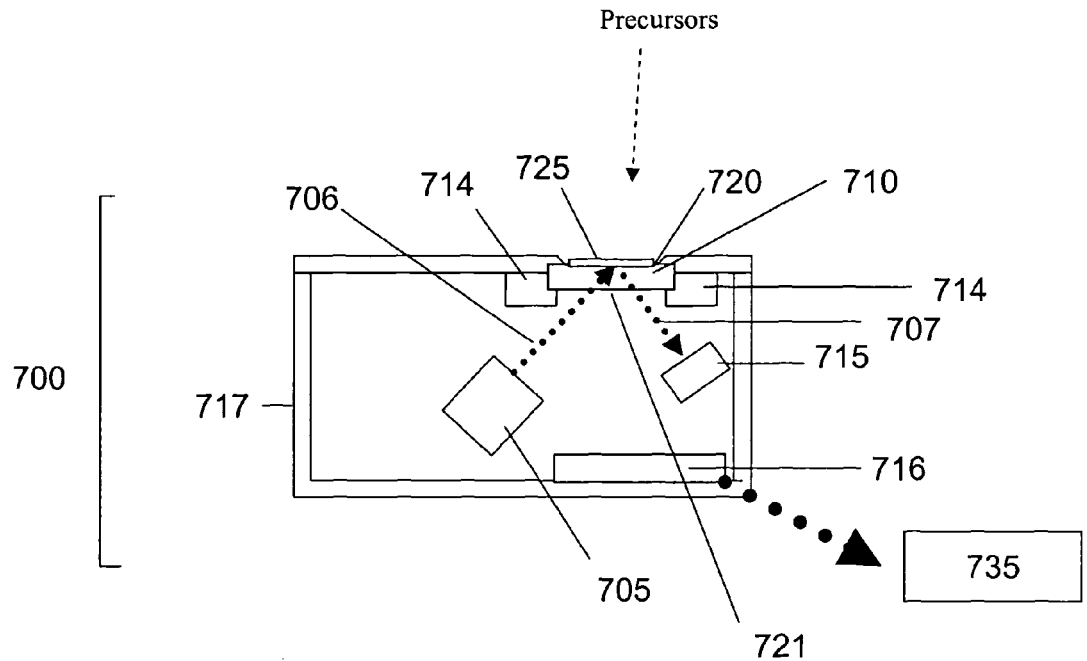
FIG. 9A shows a schematic diagram illustrating a side view of a moveable optical sensor of the present invention for positioning on a means for translating the sensor in the flux region of a thin film processing system.

The present invention includes methods and devices having a moving optical sensor that is capable of movement along a trajectory in a flux region of a thin film processing system that is substantially coincident with the trajectories of one or more substrates undergoing translation and/or rotating during thin film processing. FIG. 9A shows a schematic diagram illustrating a moveable optical sensor of the present invention for positioning on a means for translating the sensor in the flux region of a thin film processing system. Moveable optical sensor 700 comprises optical source 705, sensor substrate 710, detector 715, and wireless transmitter 716. Each of these elements are provided in housing element 717, which is capable of integration with a means of translation, such as integration with a sub-planet of a dual rotation planetary system.

Optical source 705 generates optical beam 706 that is directed onto a fixed position sensor substrate 710 supported by mounting elements 714. Fixed position sensor substrate 710 is positioned such that external surface 720 is exposed to a flux of precursors in a thin film processing system, and internal surface 721 is positioned such that it is exposed to optical beam 706. In the exemplary embodiment shown in FIG. 9A, thin film processing system is a vapor deposition system and external surface 720 is exposed to precursors, thereby resulting in formation of one or more thin films 725 on external surface 720. Optical beam 706 interacts with sensor substrate 710 and thin film(s) 725, thereby generating reflected beams 707 at external surface 720, interfaces between thin film layers and the interface between the thin film layer(s) and the processing chamber, which are detected by detector 715. Detector 715 may be configured to detect the intensity of the reflected beams 707, the polarization states of the reflected beams 707, the frequency distributions of the reflected beams 707 or any combination of these as a function of time. The output from detector 715 is provided to wireless transmitter which generates a wireless output signal that is sent to receiver 735. In one embodiment, sensor substrate comprises the same material(s) and has the same shape as a substrate(s) undergoing thin film processing.

In an embodiment useful for monitoring the optical thickness of thin film(s) 725 on external surface 720, light source 705 generates a coherent optical beam 706. In this embodiment, the beams reflected at external surface 720, interfaces between thin film layers and the interface between the thin film layer(s) and the processing chamber undergo constructive and/or destructive optical interference, and measurement of the intensity of detected light as a function of time provides a means of determining the optical thickness of thin film(s) 725 on external surface 720. In another embodiment, the frequency of the detected light is systematically varied to provide a measurement of the absorption and/or transmission spectrum of thin film(s) 725 on external surface 720. In other useful embodiments, optical source optical source 705 and detector 715 are configured such that the refractive index, morphology and/or composition of thin film(s) 725 on external surface 720 is monitored in real time.

Optical sources 705 useable in this aspect of the present invention include tunable narrow band optical sources such as tunable diode lasers, fixed frequency narrow band optical sources such as a HeNe laser, narrow band optical sources providing a plurality of narrow bands of light, broad band sources such as blackbody sources or light emitting diodes or any combination of these. Optical sources and detectors may be provided with additional optical components (not shown in FIG. 9A) for filtering the frequencies of optical beam incident on internal surface 721 and/or the detected light, such as Fabry-Perot etalons filters (tunable or fixed frequency), spectrometers, gratings and prisms. Optionally, detector 715 is operably connected to a microprocessor (not shown in FIG. 9A) that processes output signals generated by detector 715, thereby generating real time measurements of optical thickness, physical thickness, refractive index, composition, absorption/transmission spectrum and/or morphology of the thin film(s) 725 on external surface 720. In this embodiment, real time measurements are provided to wireless transmitter 716 which generates output signals transmitted to receiver 735 corresponding to the real time measurements. Detectors 715 useful for the present methods and devices include photodiodes, diode arrays, photomultiplier tubes, detector arrays, charge coupled devices and all equivalents.

Figure 9B:
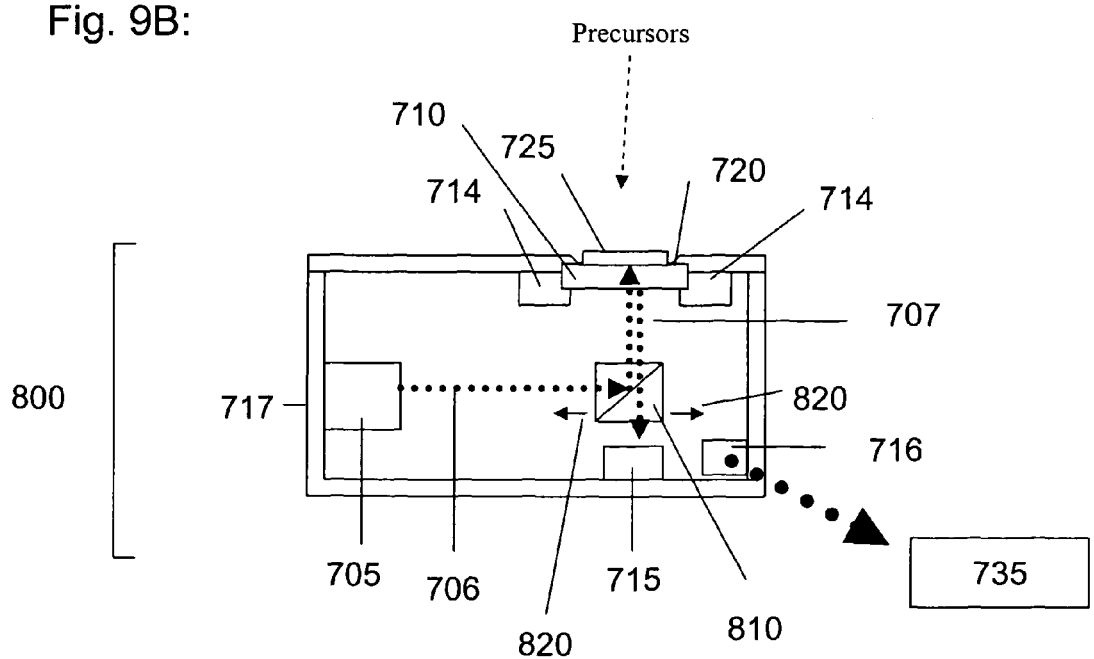
FIG. 9B is a schematic diagram illustrating a side view of a moveable optical sensor capable of spatially characterizing thin film(s) deposited on the external surface of a sensing substrate.

FIG. 9B is a schematic diagram illustrating a moveable optical sensor capable of spatially characterizing thin film(s) deposited on the external surface of a sensing substrate. As shown in FIG. 9B, the moveable optical sensor 800 further comprises a means 810 for translating optical beam 706 across external surface 720 of sensor substrate 710. In the embodiment illustrated in FIG. 9B, means 810 for translating optical beam 706 across external surface 720 comprises a partially reflective reflector 810 provided in optical communication with optical source 705 and capable of rotation about one or more rotational axes (schematically indicated by arrows 820). Rotation of the partially reflective reflector 810 directs optical beam 706 to different regions on thin film(s) 725, thereby providing a means of accurately spatially characterizing the optical thicknesses, physical thicknesses, compositions, morphology, absorption/transmission spectra, refractive indices or any combination of these of thin film(s) 725. As shown in FIG. 9A, partially reflective reflector 810 is also capable of transmitting at least a portion of light reflected by sensor substrate 710 and thin film(s) 725 such that it can be detected by detector 715.

Use of a moveable optical sensor provides several advantages beneficial for certain applications of the devices and methods of the present invention. First, movable optical sensors are capable of providing accurate real time measurements of the optical thicknesses of thin film(s) processed on substrates. Importantly, these measurements do not rely on assumed densities, compositions, and/or refractive indices of processed materials. Furthermore, optical sensors provide optical thickness measurements with enhanced accuracy for certain fabrication applications, such as fabrication of narrow band optical filters. Second, movable optical sensors are capable of measuring the refractive index, transmission spectrum and/or absorption spectrum of processed material on the sensor substrate in real time. Finally, use of optical sensors having a means for translating the optical beam incident to the sensor substrate provides an effective means for spatially characterizing physical, optical and chemical properties of deposited thin films.

EXAMPLE 2

Film Thickness Monitoring and Control Methods Incorporating an SC Cut Quartz Crystal Monitor Thin film processing systems and related methods of the present invention having a deposition sensor that moves along a trajectory that is substantially coincident with the trajectories of substrates undergoing processing enables realization of significant further improvements in film thickness control. In one embodiment, thin film processing systems of the present invention further comprise a moveable quartz crystal microbalance deposition sensor having a doubly rotated cut, such as an SC-cut, capable of operation in a manner that is significantly less susceptible to film thickness errors arising from changes in the temperature of the sensor and stress exerted on the sensor by deposited films than conventional AT cut quartz crystal deposition sensors. Use of a moveable SC-cut quartz crystal microbalance deposition sensor capable of movement along a trajectory substantially coincident with the trajectories of substrates undergoing processing and capable of excitation on at least two different modes, for example, leads to unprecedented gains in thickness control, thereby providing a robust fabrication platform for producing a range thin film structures and devices having film thicknesses selected with enhanced accuracy and exhibiting enhanced piece-to-piece uniformity.

In fixed-sensor monitoring and control systems the errors caused by a changing parts-to-monitor ratio are typically large enough to overwhelm other sources of error in the sensor measurement, such as errors arising from changes in the temperature and the stress environment of a quartz crystal deposition sensor, rendering these other sources of error irrelevant with respect to the degree of processing control provided by the system. Elimination of errors due to the fluctuations of the parts-to-monitor ratio in thin-film coating achieved by using a sensor that follows a path that is substantially coincident with the path of the parts (i.e. substrates) undergoing processing allows for further improvement in layer thickness control by minimizing or eliminating other sources of error in the quartz crystal microbalance deposition sensor. Two significant sources of error common to measurements made by quartz-crystal microbalance deposition sensors are temperature fluctuations and coating-applied stress. In this example, systems and methods are provided that minimize or eliminate processing thickness control errors arising from these sources.

Thin films produced by ion beam sputtering deposition and other deposition techniques have a large amount of stress. Stresses in a deposited single or multi-layer film on a quartz crystal microbalance deposition sensor may give rise to significant sources of error or uncertainty in layer thickness control. Quartz crystal microbalances comprise quartz crystals cut from a bulk crystal with the crystal axes in different orientations relative to the normal of the sensing surface (or coating surface) of the microbalance. The various crystal cuts have different physical, mechanical and electrical properties, and in particular they have different sensitivities to temperature and surface stress. The industry standard for optical thin-film monitors is the AT-cut of quartz, which provides a fundamental mode of oscillation with a frequency that can be relatively insensitive to temperature fluctuations over a narrow range of temperatures. The frequencies of AT-cut crystals, however, tend to be somewhat sensitive to accumulated stresses in the deposited film. Moreover, the stress coefficient (i.e. the amount of frequency change per unit of stress) exhibits substantial variation from crystal to crystal. Even if more accurate cutting of the quartz crystals could lead to a more consistent stress coefficient, the stress levels in a single or multi-layer thin film structure are unknown and difficult to predict for a particular thin film design. The effect of this uncertain or uncharacterized stress and the random nature of the stress coefficient of these quartz crystal microbalances lead to significant errors in layer thickness.

Doubly rotated quartz crystal cuts, such as a SC-cut, have an oscillation mode with a frequency that is much less sensitive to stress in the deposited film. A second advantage of a SC-cut crystal (and certain other cuts) is that the temperature of the crystal can be monitored by measuring and comparing frequencies of two different oscillation modes of the crystal, because different modes have different temperature coefficients (i.e. change in frequency per unit change in temperature). Use of a quartz microbalance deposition sensor having a SC-cut quartz crystal that moves on a path that is substantially coincident with the parts that are being coated, provides a layer thickness control system that is more accurate than a deposition sensor based on an AT-cut crystal that also moves on a substantially coincident path.

Thin film deposition processes put a significant thermal load on the crystal of a quartz crystal microbalance deposition sensor and on the surrounding body of the crystal holder. When the deposition beam is turned on, the crystal is heated on a timescale associated with the thermal properties of the crystal itself. The warming of the crystal holder and surrounding structure occurs on a second timescale that is usually longer. Because much of the thermal load is directly on the crystal, it is difficult to infer the temperature of the crystal from separate temperature sensors which cannot be mounted directly on the crystal. By monitoring frequencies of two oscillation modes of the quartz crystal, however, we can infer the temperature of the crystal. Experiments show that the dependence of the frequencies of the two modes (labeled here with subscripts A and B) on temperature and mass can be well approximated by $f_A(m,T)=g_A(m)+h_A(T)$ and $f_B(m,T)=g_B(m)+h_B(T)$, where $f_i(m,T)=[F_{i0}-F_i(m,T)]/F_{i0}$ are fractional frequency changes from the initial (unloaded) frequency $F_{i0}$ for each mode, i=A,B. Here $h_i(T)$ are functions that can be measured by warming the crystal without deposition, and $g_i(m)$ are functions of mass that do not tend to change much from crystal to crystal, and can be measured by loading a crystal by varying amounts of deposited film and then measuring the frequencies at a fixed temperature without the deposition beam on. Given these known functions, measurements of the initial frequencies for the two modes, and measurements of the frequencies of the two modes, we can solve these two equations for unknown values of T and m (now corrected for temperature). This can be carried out during the deposition process while thermal loading is occurring.

Figure 10:
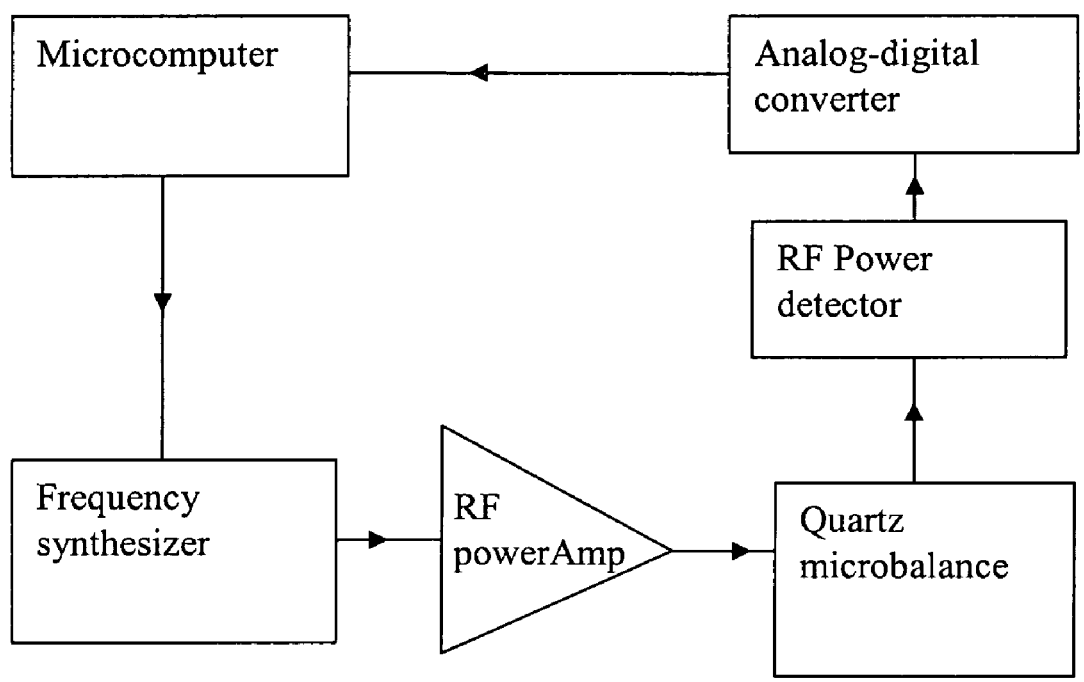
FIG. 10 shows a block diagram of an electronic circuit for monitoring the resonant frequencies of two (or several) modes of a quartz microbalance crystal.

FIG. 10 shows a block diagram of an electronic circuit for monitoring the resonant frequencies of two (or several) modes of a quartz microbalance crystal. The measurement of the frequencies of the two modes is performed using a circuit based on an on-board computer, a computer-controlled frequency synthesizer, an RF power amplifier, an RF power detector, and an analog-to-digital converter. The arrows show the flow of information. In one embodiment, the measurement is a two-step process. First, in order to locate the mode frequencies of the crystal approximately, the frequency of the frequency synthesizer, (f) is swept though a range of frequencies containing one of the mode resonance frequencies. The AC current on the crystal rises and passes through a maximum when the frequency of the synthesizer approaches and passes through the resonance frequency of the first mode (mode A). This amplitude is converted to a DC voltage by the RF power detector, which we call the DC resonance amplitude signal, $V_A(f)$. This signal is then converted to a digital number which is repeatedly read by the computer as the frequency sweep proceeds. The center frequency will be near the location of the maximum. Another range of frequencies that contains the resonance frequency of the next mode (mode B) is swept and the maximum of the corresponding resonance amplitude signal, $V_B(f)$ locates approximately that resonance frequency. After the mode frequencies are located approximately using this procedure, a locking scheme based on square wave frequency modulation is used to measure and follow the resonant frequency more precisely. For a frequency f near resonance A, the frequency of the synthesizer is stepped alternately to frequencies shifted slightly on either side of the resonance by a frequency modulation amplitude, $\Delta f$, $f\pm\Delta f$. The modulation amplitude $\Delta f$ is on the order of the half width of the peaked curve measured in the first step of the measurement. At each of these frequencies the resonance amplitude signals are read, and the central frequency f is adjusted in proportion to the difference: $V_A(f-\Delta f)-V_A(f+\Delta f)$ so as to force this difference to zero. When this is true, the central frequency is the refined measurement of the resonance frequency of mode A: $f_A=f$. Then the system repeats this to measure the resonance frequency of the second mode (mode B), thus finding the refined resonance frequency $f_B$. From these two measurements, the temperature and thickness (corrected for temperature) are found as described above.

As will be obvious to one of skill in the art, other readout circuits and electronic systems can be used in the present invention for measuring the frequency of A and B modes (an optionally other modes) of the SC cut quartz microbalance deposition sensor. In addition to readout circuits that excite A and B modes sequentially, the present invention includes readout circuits capable of simultaneously exciting A and B modes such as those described in U.S. Pat. Nos. 5,869,763, 4,872,765 and 4,079,280.

The mode frequencies can also be determined by using the crystal in an active oscillator with a switchable filter to alternately isolate the two modes of oscillation, and a frequency counter. Fundamental mode SC-cut quartz crystal microbalances exhibit resonances in two distinct modes. These modes are called the c-mode and the b-mode. In one embodiment, $f_A$ corresponds to the resonance frequency of the c-mode, and $f_B$ corresponds to the resonance frequency of the b-mode. For an overtone SC-cut quartz crystal microbalance there are four distinct modes of oscillation: fundamental c-mode, fundamental b-mode, overtone c-mode, overtone b-mode. For the overtone SC-cut quartz crystal microbalance there are three embodiments: (1) $f_A$ corresponds to overtone c-mode and $f_B$ corresponds to fundamental b-mode; (2) $f_A$ corresponds to overtone c-mode and $f_B$ corresponds to overtone b-mode; (3) $f_A$ corresponds to overtone c-mode and $f_B$ corresponds to fundamental c-mode.

Figure 11A:
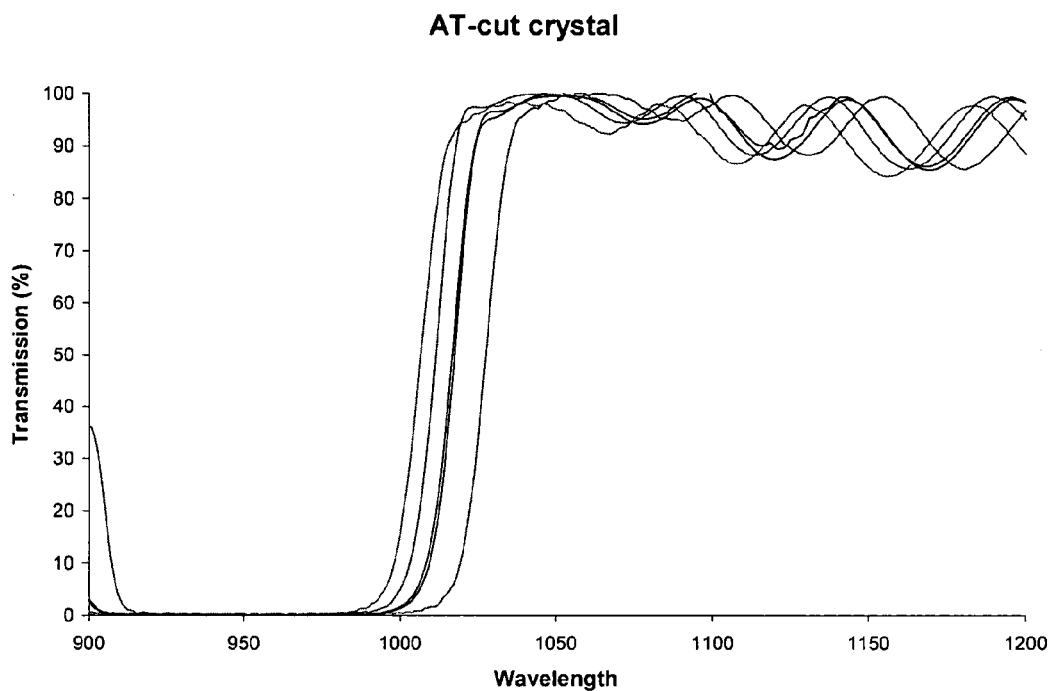
FIGS. 11A and 11B shows the process improvements of the monitor based on the SC-cut quartz crystal with temperature corrections as described in the previous paragraph, compared to the monitor based on the AT-cut quartz crystal.
Figure 11B:
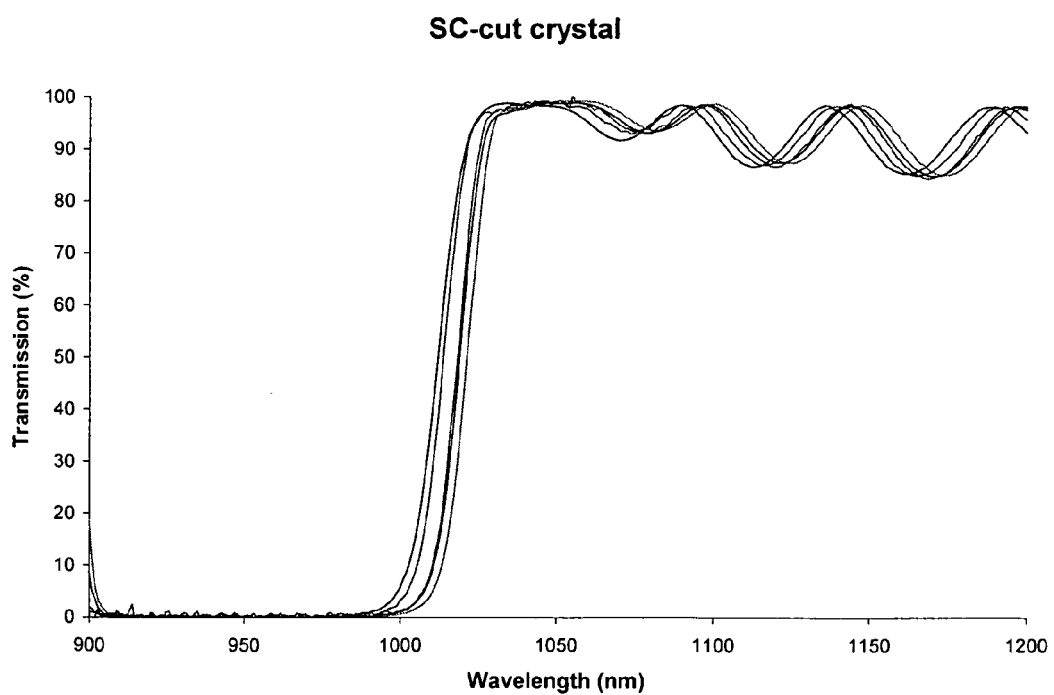

The time sequence of thickness measurements obtained in this way is then used to control the deposition process as described herein. FIGS. 11A and 11B shows the process improvements of the monitor based on the SC-cut quartz crystal with temperature corrections as described in the previous paragraph, compared to the monitor based on the AT-cut quartz crystal. FIG. 11A corresponds to deposition control provided by an AT-cut quartz crystal microbalance and FIG. 11B corresponds to deposition control provided by an SC-cut quartz crystal microbalance. In both cases, the monitor follows a substantially coincident trajectory with the parts, in order to eliminate or reduce errors caused by fluctuations in the parts-to-monitor ratio. The multi-layer thin film coating is designed to make a sharp-edge filter. In both cases the monitors are traveling on paths that are substantially coincident with the parts (e.g. substrates), and the optical spectra of the resulting parts are shown for five nearly successive runs. Note that the centering (horizontal location of the edge) is better controlled for the SC-cut quartz crystal microbalance, and the shape of the high-transmitting edge is more consistent as well. Both the better centering and the more consistent shape are reflections of improved layer thickness control.

Use of a moving deposition sensor (e.g. SC-cut or AT-cut quartz crystal microbalance) that moves along a trajectory that is substantially coincident with the trajectories of substrates undergoing processing enables the physical thickness of deposited thin films to be selected to within 1.2%. Use of the combination of a moving deposition sensor moves along a trajectory that is substantially coincident with the trajectories of substrates undergoing processing having a SC-cut quartz crystal microbalance that is excited on two or more modes, however, enables the physical thickness of deposited thin films to be selected to within 0.3%. This enhancement in thickness control constitutes an improvement over conventional methods using a fixed position AT-Cut quartz crystal microbalance equal to about a factor of ten.

We claim:

1. A device for processing a thin film on a substrate, said device comprising:
   a thin film deposition source for generating a flux of precursors in a flux region;
   a dual rotation planetary system including a central planet having a central rotational axis and a plurality of sub-planets, each sub-planet positioned on said central planet and having a sub-planet rotational axis;
   a substrate positioned on a first sub-planet at a first distance from a rotational axis of said first sub-planet, said substrate having a receiving surface for receiving said precursors;
   a sensor positioned on a second sub-planet at a second distance from a rotational axis of said second sub-planet, said sensor having a sensing surface for receiving said precursors, wherein said first distance and said second distance are the same; wherein rotation of said central planet and said first sub-planet provide a receiving surface trajectory in said flux region and rotation of said central planet and said second sub-planet provide a sensing surface trajectory in said flux region that is substantially coincident with said receiving surface trajectory, wherein said sensing surface trajectory and said receiving surface trajectory are substantially coincident when $$\left[ \left\{ \left( \frac{T_{\dot{P}Sensing}(t, t+\Delta t) - T_{\dot{P}Receiving}(t, t+\Delta t)}{T_{\dot{P}Receiving}(t, t+\Delta t)} \right)^2 \right\}_t \right]^{1/2} < A,$$

wherein A is a tolerance in fractional accuracy of a layer thickness of precursors deposited on said receiving surface over a selected time scale, $\Delta t$, and $T_{\dot{P}sensing}(t, t+\Delta t)$ and $T_{\dot{P}receiving}(t, t+\Delta t)$ are time dependent process source thickness factors for the sensing and receiving surfaces, respectively; and wherein said sensor is not positioned between said substrate and said thin film deposition source.

2. The device of claim 1 wherein rotation of said central planet and said first and second sub-planets results in substantially the same average fluxes of precursors to said receiving surface and said sensing surface for a selected deposition time.

3. The device of claim 1 wherein the receiving surface of the substrate and the sensing surface of the sensor simultaneously receive said precursors.

4. The device of claim 1 wherein said first sub-planet rotational axis and second sub-planet rotational axis are positioned the same distance from said central rotational axis.

5. The device of claim 4 wherein rotation of said central planet moves said substrate and said sensor in a circular orbit about said central rotational axis of said dual rotation planetary system.

6. The device of claim 4 wherein rotation of said first sub-planet rotates said receiving surface about said first sub-planet rotational axis.

7. The device of claim 4 wherein rotation of said second sub-planet rotates said sensing surface about said second sub-planet rotational axis.

8. The device of claim 1 wherein said sensor further comprises a wireless transmitter for generating an output signal corresponding to a measurement made by said sensor, wherein said output signal comprises infrared radiation, radio waves or both.

9. The device of claim 8 further comprising a receiver for receiving said output signal generated from said transmitter.

10. The device of claim 9 further comprising a thin film deposition source controller in communication with said receiver for receiving said output signal, wherein said thin film deposition source controller controls the source distribution profile of precursors in said flux region.

11. The device of claim 1 wherein said sensor is a mass sensor for measuring the mass of precursors deposited on said sensing surface.

12. The device of claim 11 wherein said mass sensor is a quartz crystal microbalance deposition sensor having an SC-cut quartz crystal that is capable of excitation of at least two different modes, wherein said modes are selected from the group consisting of: a fundamental c-mode, a fundamental b-mode, an overtone c-mode, and an overtone b-mode.

13. The device of claim 11 wherein said mass sensor further comprises circuitry for reading said sensor, and wherein said circuitry is positioned such that it rotates and translates with said sensing surface.

14. The device of claim 1 wherein said sensor is selected from the group consisting of:
   an optical thickness monitor for measuring the optical thickness of a thin film of precursors on said sensing surface;

a temperature sensor for measuring the temperature of said sensing surface;
a refractive index monitor for measuring the refractive index of a thin film of precursors on said sensing surface;
an electrometer for measuring the electric charge of a thin film of precursors on said sensing surface; and
an accelerometer for measuring the acceleration of said sensor.

15. The device of claim 1 where said sensor comprises a plurality of different sensors selected from the group consisting of:
a mass sensor;
an optical thickness monitor;
a temperature sensor;
a refractive index monitor;
an electrometer; and
an accelerometer.

16. The device of claim 1 wherein said sensor comprises a sensor array, wherein said sensor array comprises a plurality of sensors positioned at different distances from said second rotational axis.

17. The device of claim 1 wherein said sensor is powered by a wireless means of providing power, wherein said wireless means of providing power is capable of providing power to said sensor radiatively, magnetically, mechanically or using an on-board battery power source.

18. The device of claim 1, wherein A is 0.3% or less and Δt is 30 minutes.

19. The device of claim 1, wherein A is 1.2% or less.

20. The device of claim 1, wherein A is 2% and Δt is 3 minutes.

21. A device for processing a thin film on a substrate, said device comprising:
a thin film deposition source for generating a flux of precursors in a flux region;
a dual rotation planetary system including a central planet having a central rotational axis and a plurality of sub-planets, each sub-planet positioned on said central planet and having a sub-planet rotational axis;
a substrate positioned on a first sub-planet and having a receiving surface for receiving said precursors;
wherein rotation of said central planet and said first sub-planet provide a receiving surface trajectory in said flux region;
a quartz crystal microbalance deposition sensor comprising a quartz crystal having an SC cut, said sensor positioned on said first sub-planet and having a sensing surface for receiving said precursors;
wherein rotation of said central planet and said first sub planet provide a sensing surface trajectory in said flux region that is substantially coincident with said receiving surface trajectory,
wherein said sensing surface trajectory and said receiving surface trajectory are substantially coincident when $$\left[\left(\left(\frac{T_{\bar{p}Sensing}(t, t+\Delta t) - T_{\bar{p}Receiving}(t, t+\Delta t)}{T_{\bar{p}Receiving}(t, t+\Delta t)}\right)^2\right)^{1/2}\right]_t < A,$$

wherein A is a tolerance in fractional accuracy of a layer thickness of precursors deposited on said receiving surface over a selected time scale, Δt, and $T_{Psensing}(t,t+t)$ and $T_{Preceiving}(t,t+\Delta t)$ are time dependent process source thickness factors for the sensing and receiving surfaces, respectively; and wherein said sensor is not positioned between said substrate and said thin film deposition source.

22. The device of claim 21 further comprising a readout circuit electrically connected to said quartz crystal microbalance deposition sensor, wherein said readout circuit is capable of exciting at least two different modes of said quartz crystal having said SC cut, wherein said modes are selected from the group consisting of: a fundamental c-mode, a fundamental b-mode, an overtone c-mode, and an overtone b-mode.

23. The device of claim 21, wherein A is 0.5% and Δt is 5 minutes.

24. A device for processing a thin film on a substrate, said device comprising:
a thin film deposition source for generating a flux of precursors in a flux region;
a dual rotation planetary system including a central planet having a central rotational axis, a plurality of sub-planets, each sub-planet positioned on said central planet and having a sub-planet rotational axis;
a substrate having a receiving surface for receiving said precursors, said substrate positioned on a first sub-planets; and
a sensor having a sensing surface for receiving said precursors, said sensor positioned on a second sub-planets;
wherein a first sub-planet rotational axis of the first sub-planet and a second sub-planet rotational axis of the second sub-planet are each positioned the same distance from said central rotational axis, thereby providing a receiving surface trajectory in said flux region that is substantially coincident with a sensing surface trajectory in said flux region.

25. The device of claim 24, wherein said first and second sub-planets are the same sub-planet.

26. The device of claim 24, wherein said first and second sub-planets are different sub-planets.

27. The device of claim 24, wherein said substrate is positioned on said first sub-planet at a first distance from said first sub-planet rotational axis and said sensor is positioned on said second sub-planet at a second distance from said second sub-planet rotational axis and wherein said first distance is less than or equal to said second distance, thereby providing said receiving surface trajectory in said flux region substantially coincident with said sensing surface trajectory in said flux region.

28. The device of claim 24, wherein said sensor does not block said substrate receiving surface from receiving said precursors.

29. The device of claim 24, wherein said sensor is not positioned between said receiving surface and said thin film deposition source.

30. A device for processing a thin film on a substrate, said device comprising:
a thin film deposition source generating a flux of precursors in a flux region;
a dual rotation planetary system including a central planet having a central rotational axis and a plurality of sub-planets, each sub-planet positioned on said central planet and having a sub-planet rotational axis;
a substrate positioned on a first sub-planet at a first distance from said first sub-planet rotational axis and having a receiving surface receiving said precursors, said receiving surface having a receiving surface trajectory in said flux region;
a plurality of sensors positioned on a second sub-planet at a plurality of distances from said second sub-planet rotational axis, each sensor having a sensing surface receiving said precursors, said sensing surfaces each having a sensing surface trajectory in said flux region;

wherein said first distance is equal to one of said plurality of distances, thereby providing one or more of said sensing surface trajectories substantially coincident with said receiving surface trajectory, wherein a sensing surface trajectory and said receiving surface trajectory are substantially coincident when $$\left[\left\langle\left(\frac{T_{\tilde{p}Sensing}(t,\,t+\Delta t)-T_{\tilde{p}Receiving}(t,\,t+\Delta t)}{T_{\tilde{p}Receiving}(t,\,t+\Delta t)}\right)^2\right\rangle_t\right]^{1/2}<A,$$

wherein A is a tolerance in fractional accuracy of a layer thickness of precursors deposited on said receiving surface over a selected time scale, $\Delta t$, and $T_{Psensing}(t, t+\Delta t)$ and $T_{Preceiving}(t, t+\Delta t)$ are time dependent process source thickness factors for the sensing and receiving surfaces, respectively.

31. The device of claim 30, wherein A is 0.3% or less and $\Delta t$ is 30 minutes.

32. The device of claim 30, wherein A is 2% and $\Delta t$ is 3 minutes.

33. The device of claim 30, wherein A is 0.5% and $\Delta t$ is 5 minutes.

34. The device of claim 30, wherein at least one of said plurality of sensors is an optical sensor.

35. The device of claim 34, wherein said optical sensor is an optical thickness monitor or a refractive index monitor.

36. The device of claim 30, wherein at least one of said plurality of sensors is a mass sensor.

37. The device of claim 30, wherein at least one of said plurality of sensors does not block said receiving surface from receiving said precursors.

38. The device of claim 30, wherein at least one of said plurality of sensors is not positioned between said receiving surface and said thin film deposition source.

39. The device of claim 30, further comprising a plurality of substrates, each positioned on one of said plurality of sub-planets and having a receiving surface for receiving said precursors, each of said receiving surfaces having a receiving surface trajectory in said flux region and wherein each of said receiving surface trajectories in said flux region are substantially coincident with one or more of said sensing surface trajectories.

40. The device of claim 39, wherein at least one of said plurality of sensors does not block at least one of said plurality of substrates from receiving said precursors on said receiving surfaces.

41. The device of claim 39, wherein at least one of said sensors is not positioned between said thin film deposition source and at least one of said plurality of substrates.

* * * * *

UNITED STATES PATENT AND TRADEMARK OFFICE
CERTIFICATE OF CORRECTION

PATENT NO. : 7,828,929 B2
APPLICATION NO. : 11/314811
DATED : November 9, 2010
INVENTOR(S) : Lee et al.

It is certified that error appears in the above-identified patent and that said Letters Patent is hereby corrected as shown below:

In the Specification:

In claim 21, column 39, line 65, please replace "$T_{Psensing}(t,t+t)$" with --$T_{Psensing}(t,t+\Delta t)$--.

In claim 24, column 40, lines 23 and 24, please replace "first sub-planets" with --first sub-planet--.

In claim 24, column 40, line 26, please replace "second sub-planets" with --second sub-planet--.

Signed and Sealed this
Nineteenth Day of July, 2011

David J. Kappos
*Director of the United States Patent and Trademark Office*

UNITED STATES PATENT AND TRADEMARK OFFICE
CERTIFICATE OF CORRECTION

PATENT NO. : 7,828,929 B2  
APPLICATION NO. : 11/314811  
DATED : November 9, 2010  
INVENTOR(S) : Lee et al.

Page 1 of 1

It is certified that error appears in the above-identified patent and that said Letters Patent is hereby corrected as shown below:

In the Claims:

In claim 1, column 38, line 9, replace "$T_{Psensing}(t,t+\Delta t)$" with -- $T_{\bar{P}Sensing}(t, t+\Delta t)$ --.

In claim 1, column 38, line 10, replace "$T_{Preceiving}(t, t+\Delta t)$" with -- $T_{\bar{P}Receiving}(t, t+\Delta t)$ --.

In claim 21, column 39, line 66, replace "$T_{Preceiving}(t,t+\Delta t)$" with -- $T_{\bar{P}Receiving}(t, t+\Delta t)$ --.

In claim 30, column 41, line 19, replace "$T_{Psensing}(t, t+\Delta t)$" with -- $T_{\bar{P}Sensing}(t, t+\Delta t)$ --.

In claim 30, column 41, line 20, replace "$T_{Preceiving}(t, t+\Delta t)$" with -- $T_{\bar{P}Receiving}(t, t+\Delta t)$ --.

Signed and Sealed this  
Sixteenth Day of April, 2013

Teresa Stanek Rea  
*Acting Director of the United States Patent and Trademark Office*